(12) United States Patent
Dosho et al.

(10) Patent No.: US 7,030,688 B2
(45) Date of Patent: Apr. 18, 2006

(54) LOW-PASS FILTER FOR A PLL, PHASE-LOCKED LOOP AND SEMICONDUCTOR INTEGRATED CIRCUIT

(75) Inventors: Shiro Dosho, Ikeda (JP); Naoshi Yanagisawa, Osaka (JP); Masaomi Toyama, Takatsuki (JP); Keijiro Umehara, Uji (JP); Masahiro Fukui, Ibaraki (JP); Takefumi Yoshikawa, Katano (JP); Toru Iwata, Osaka (JP); Shiro Sakiyama, Yawata (JP); Ryoichi Suzuki, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 8 days.

(21) Appl. No.: 10/500,875

(22) PCT Filed: May 22, 2003

(86) PCT No.: PCT/JP03/06428

§ 371 (c)(1),
(2), (4) Date: Jul. 7, 2004

(87) PCT Pub. No.: WO03/098807

PCT Pub. Date: Nov. 27, 2003

(65) Prior Publication Data

US 2005/0077955 A1     Apr. 14, 2005

(30) Foreign Application Priority Data

May 22, 2002 (JP) ............................. 2002-148129
Sep. 9, 2002 (JP) ............................. 2002-262793
Sep. 30, 2002 (JP) ............................. 2002-286987

(51) Int. Cl.
*H03K 5/00* (2006.01)

(52) U.S. Cl. ..................................... 327/558; 327/157

(58) Field of Classification Search ........ 327/156–158, 327/552–559, 311, 337, 147–148
See application file for complete search history.

(56) References Cited

U.S. PATENT DOCUMENTS 5,266,852 A * 11/1993 Shigenari et al. ........... 327/552

(Continued)

FOREIGN PATENT DOCUMENTS

| EP | 0 595 632 A | 5/1994 |
| EP | 0 642 227 A | 3/1995 |
| JP | 56-119520 A | 12/1981 |

*Primary Examiner*—Dinh T. Le
(74) *Attorney, Agent, or Firm*—McDermott Will & Emery LLP

(57) ABSTRACT

The invention provides a low-pass filter suitably used as a loop filter for a PLL or a DLL that has a filtering characteristic equivalent to that of a conventional one and can be realized in a smaller circuit area. The low-pass filter includes first filtering means (31) for accepting, as an input, an input signal to the low-pass filter and outputting a first voltage; a circuit element (311) included in the first filtering means (31) for allowing a first current to flow in accordance with the first voltage; current generating means (32) for generating a second current at a given rate to the first current; second filtering means (33) for accepting, as an input, the second current and outputting a second voltage; and adding means (34) for adding the first voltage and the second voltage and outputting an output signal of the low-pass filter, in which the second current is set to be smaller than the first current.

43 Claims, 31 Drawing Sheets

U.S. PATENT DOCUMENTS

| | | |
|---|---|---|
| 5,495,512 A | 2/1996 | Kovacs et al. |
| 5,530,399 A * | 6/1996 | Chambers et al. .......... 327/561 |
| 5,668,468 A * | 9/1997 | Cargill ....................... 323/316 |
| 5,945,874 A * | 8/1999 | Punzenberger et al. ..... 327/558 |
| 6,075,394 A | 6/2000 | Norio |
| 6,091,289 A * | 7/2000 | Song et al. ................. 327/558 |

* cited by examiner (a)

(b)

(a)

P. S. type (b)

P. I. type

LSI including PLL or DLL
of this invention

Exemplified
application to IC card

COC component
including PLL or DLL
of this invention       Base member
                        for adhesion Exemplified application
to COC component Exemplified
application to LSI pad Exemplified application
to MPU clock (a)

(b)

(a)

(b)

LOW-PASS FILTER FOR A PLL, PHASE-LOCKED LOOP AND SEMICONDUCTOR INTEGRATED CIRCUIT

TECHNICAL FIELD

The present invention relates to a low-pass filter, and more particularly, it relates to a low-pass filter suitably used as a loop filter in a phase-locked loop and the like, and a technique for a phase-locked loop including such a low-pass filter.

BACKGROUND ART

A phase-locked loop (hereinafter referred to as a "PLL") is now an indispensable element in a semiconductor integrated circuit system and is included in almost all LSIs. Also, there are broad ranges of applications of PLLs extending over various fields such as communications equipment, microprocessors and IC cards.

FIG. 32 shows the architecture of a general charge pump type PLL. The outline of the PLL will now be described with reference to this drawing. A phase comparator 10 compares an input clock CKin supplied to the PLL with a feedback clock CKdiv so as to output an up signal UP and a down signal DN in accordance with a phase difference between these clocks. A charge pump circuit 20 outputs a charge current Ip on the basis of the up signal UP and the down signal DN. A loop filter 30 smoothes the charge current Ip so as to output a voltage Vout. A voltage controlled oscillator 40 changes the frequency of an output clock CKout of the PLL on the basis of the voltage Vout. An N frequency divider 50 divides the output clock CKout in the frequency by "N" so as to feedback the divided clock to the phase comparator 10 as the feedback clock CKdiv. While these operations are repeated, the output clock CKout is gradually converged into a desired frequency to be locked.

Among the above-described elements of the PLL, the loop filter 30 is particularly significant. It can be said that the response characteristic of the PLL is determined depending upon the filtering characteristic of the loop filter 30.

FIG. 33 shows general loop filters. The passive filter shown in FIG. 33(a) has a disadvantage that its characteristic is changed when another circuit is connected at a subsequent stage. When the filter is varied to be active in order to overcome this disadvantage, the active filter shown in FIG. 33(b) is obtained. The transfer characteristics of these filters are equivalent. Thus, the loop filter 30 is generally realized by a low-pass filter constructed from a combination of a resistive element R and a capacitive element C.

In the control theory for the PLL, the response bandwidth of the PLL is preferably set to a frequency approximately $1/10$ of that of an input clock at most. According to this theory, in a PLL accepting, as an input, an input clock of a comparatively low frequency, it is necessary to lower the cut-off frequency of the loop filter so as to narrow the response bandwidth. Therefore, a loop filter used in a conventional PLL has a comparatively large time constant, namely, a large CR product. In order to realize a large CR product, a large-scale capacitive element is generally used.

On the other hand, the response speed of a PLL depends upon its dumping factor. The dumping factor is changed in accordance with the frequency of the input clock to the PLL, and is preferably kept constant in order to stabilize the response characteristic of the PLL. Therefore, in a conventional PLL accepting, as an input, an input clock of a wide-band frequency, the dumping factor is controlled by using a loop filter variable in its filtering characteristic.

FIG. 34 shows a conventional loop filter variable in its filtering characteristic. The loop filter of FIG. 34(a) includes resistor ladder circuits 100. The resistor ladder circuit 100 includes, as shown in FIG. 34(b), a large number of resistors and switches, so as to provide a variety of resistance values by appropriately controlling the switches. In general, a loop filter including such a resistor ladder circuit 100 is used in the PLL.

Alternatively, FIG. 35 shows another example of the conventional loop filter variable in its filtering characteristic. The loop filter 30 shown in FIG. 35 includes an integrator 30-1, an inverting amplifier 30-2 and an adder 30-3. The integrator 30-1 integrates a charge current Ip1 output from a first charge pump circuit 20a so as to output a smoothed voltage. The inverting amplifier 30-2 inverts and amplifies a charge current Ip2 output from a second charge pump circuit 20b. The adder 30-3 adds the output of the integrator 30-1 and the output of the inverting amplifier 30-2 so as to obtain an output voltage of the loop filter 30. In such a loop filter 30, the dumping factor of the PLL can be adjusted by appropriately changing the ratio between the charge current Ip1 and the charge current Ip2 (as described in, for example, Japanese Patent No. 2778421).

As described above, in a PLL accepting, as an input, an input clock of a comparatively low frequency, a capacitive element with a large size is used in order to attain a large CR product of the loop filter. Furthermore, in a PLL accepting, as an input, an input clock of a wide-band frequency, it is necessary to provide the resistor ladder circuit as shown in FIG. 34 or a plurality of charge pump circuits and operational amplifiers as shown in FIG. 35 for adjusting the dumping factor. All of these cases are factors to increase the circuit scale.

In some application products of PLLs that are difficult to externally provide a large capacitive element, it is significant to reduce the circuit area of the PLL. In an IC card in particular, elements with a size larger than the thickness of the card should not be included from the viewpoint of the reliability. Accordingly, it is substantially impossible to externally provide a large capacitive element on an IC card, and hence, the circuit area reduction of the PLL is a problem to be indispensably solved. This also applies to an LSI in which a PLL is mounted on a pad region.

Also, in an LSI having a chip-on-chip structure, a PLL included in the upper chip is preferably smaller. Furthermore, since a large number of PLLs are used in a microprocessor, the circuit area of the PLLs largely affects the circuit area of the whole microprocessor.

DISCLOSURE OF THE INVENTION

In consideration of the above-described conventional problems, an object of the invention is providing a low-pass filter that has a filtering characteristic equivalent to that of a conventional one and can be realized in a smaller circuit area, and a PLL and the like including such a low-pass filter as a loop filter. In particular, an object is realizing such a low-pass filter without using a large capacitive element. Another object is making the dumping factor of a PLL adjustable by making the filtering characteristic of such a low-pass filter variable.

FIG. 1 shows the architecture of a low-pass filter according to this invention. The low-pass filter 30 of this invention includes first filtering means 31 that accepts, as an input, an input signal to the low-pass filter and outputs a first voltage;

a circuit element 311 that is included in the first filtering means 31 and allows a first current to flow in accordance with the first voltage; current generating means 32 for generating a second current at a given rate to the first current; second filtering means 33 that accepts, as an input, the second current and outputs a second voltage; and adding means 34 that adds the first voltage and the second voltage to obtain an output signal of the low-pass filter 30.

According to this invention, the input signal to the low-pass filter is subjected to first filtering processing by the first filtering means 31, thereby outputting the first voltage. At this point, the current generating means 32 generates the second current at the given rate to the first current flowing through the circuit element 311 in the first filtering means in accordance with the first voltage. The current generating means 32 does not amplify the first current itself, and hence, the generation of the second current does not affect the output of the first filtering means 31. The second filtering means 33 disposed at the stage following the first filtering means 31 is provided not with the first current but with the second current generated by the current generating means 32. The second current is subjected to second filtering processing by the second filtering means 33, thereby outputting the second voltage. Ultimately, the adding means 34 adds the first voltage and the second voltage, so as to obtain the output signal of the low-pass filter.

In the low-pass filter having the aforementioned architecture, the given rate of the second current to the first current is changed so as to accordingly change the transfer characteristic of the second filtering means, and hence, the second filtering means outputs the second voltage equivalent to the original voltage. Therefore, the low-pass filter apparently keeps its original transfer characteristic. In other words, even when the structure of the second filtering means is changed so as to reduce the circuit scale and hence the transfer characteristic is changed, the filtering characteristic of the low-pass filter can be prevented from changing by changing the given rate in accordance with the changed transfer characteristic. Accordingly, the invention can realize a low-pass filter that has a filtering characteristic equivalent to that of a conventional one and has a circuit area smaller than the conventional one.

In the low-pass filter of this invention, the given rate is preferably a positive number smaller than 1. Thus, the second current to be generated is smaller than the first current, and hence, a capacitive element with a small capacitance value can be employed as the capacitive element used in the second filtering means. Accordingly, the second filtering means can be downsized, resulting in reducing the circuit area of the low-pass filter.

Specifically, the current generating means of the low-pass filter of this invention can be realized as a current mirror circuit for accepting, as an input, the first current and outputting the second current. On an input side of the current mirror circuit, a first semiconductor element with first conductance is provided. This first semiconductor element is also the circuit element included in the first filtering means. Also on an output side of the current mirror circuit, a second semiconductor element with second conductance at the given rate to the first conductance is provided. This circuit element may be a resistive element with a resistance value corresponding to the first conductance instead of the first semiconductor element. In this case, the current mirror circuit accepts, as the input, a third current corresponding to the first current instead of the first current.

Specifically, the circuit element of the low-pass filter of this invention can be realized as a first voltage-current converter with first conductance for converting the first voltage into the first current, and the current generating means can be realized as a second voltage-current converter with second conductance for converting the first voltage into the second current, whereas the first and second conductance are at the given rate.

Specifically, the adding means of the low-pass filter of this invention can be realized as an operational amplifier or an operational transconductance amplifier. When the operational amplifier is used, it has the second filtering means in a negative feedback portion thereof, accepts, as an input, the first voltage at a non-inverting input terminal thereof and outputs a third voltage as the output signal of the low-pass filter. Alternatively, when the operational transconductance amplifier is used, it outputs a third current as the output signal of the low-pass filter.

In the low-pass filter of this invention, preferably, the first and second semiconductor elements are respectively first and second transistors for providing the first and second conductance in accordance with supplied first and second bias currents, respectively. The first and second bias currents are changed in amplitudes thereof on the basis of a common bias control signal. The change of the first and second bias currents means change of the first and second conductance. Since the first and second conductance are thus changed, the filtering characteristic of the low-pass filter can be dynamically varied. In addition, the filtering characteristic can be varied on the basis of the bias control signal commonly used for the first and second bias currents. Accordingly, there is no need to provide a resistor ladder circuit for varying the filtering characteristic of the low-pass filter, and hence, the circuit scale can be further reduced. Furthermore, particularly when the low-pass filter is used as a loop filter for a phase-locked loop or the like, the dumping factor can be effectively and easily adjusted in accordance with the bias control signal.

Similarly, the first and second voltage-current converters preferably change the first and second conductance, respectively on the basis of a common bias control signal. Thus, the circuit scale can be further reduced for the same reason as that described above.

Furthermore, in the low-pass filter of this invention, the current mirror circuit preferably has, on an output side, the second through nth (wherein n is a natural number of 3 or more) semiconductor elements and includes switches for respectively switching outputs of currents flowing through the second through nth semiconductor elements. The switches allow one of or a sum of a plurality of the currents respectively flowing through the second through nth semiconductor elements to be output as the second current. Thus, the amplitude of the second current can be switched in a stepwise manner, namely, digitally.

Furthermore, in the architecture in which the circuit element is a resistive element, the circuit element may be, instead of the resistive element, a resistor ladder circuit. In this case, the resistor ladder circuit is able to change its resistance value in accordance with change of the first conductance. Thus, the filtering characteristic of the low-pass filter can be dynamically varied.

On the other hand, the feedback system of this invention includes a charge pump circuit for generating a charge current on the basis of a phase difference between an input clock and a clock resulting from feedback; a loop filter for accepting the charge current as an input; and output clock generating means for generating an output clock on the basis of an output signal from the loop filter. The loop filter includes first filtering means for accepting the charge current as an input and outputting a first voltage; a circuit element included in the first filtering means for allowing a first current to flow in accordance with the first voltage; current generating means for generating a second current at a given rate to the first current; second filtering means for accepting the second current as an input and outputting a second voltage; and adding means for adding the first voltage and the second voltage and outputting the output signal. Thus, the low-pass filter having the architecture shown in FIG. 1 is used as the loop filter of the feedback system, and hence, the circuit area of the feedback system can be reduced.

It should be noted that a feedback system means a feedback circuit for generating an output clock on the basis of an input clock and feeding back the output clock (as a feedback clock) to make the output clock attain a desired characteristic. Typical examples are a phase-locked loop for generating an output clock of a desired frequency on the basis of an input clock; and a delay-locked loop for generating an output clock with a desired phase delay from an input clock.

Specifically, the output clock generating means is a voltage controlled oscillator that oscillates the output clock and changes an oscillation frequency on the basis of the output signal from the loop filter. Thus, a phase-locked loop with a small circuit area can be realized.

Alternatively, specifically, the output clock generating means is a voltage controlled delay circuit that changes a delay of the output clock from the input clock on the basis of the input clock and the output signal from the loop filter. Thus, a delay-locked loop with a small circuit area can be realized.

Preferably, the circuit element is capable of changing conductance thereof, and the feedback system further includes bias controlling means for changing the conductance of the circuit element and the charge current in accordance with a common bias control signal. Thus, the conductance of the circuit element and the charge current are both changed on the basis of the common bias control signal, and therefore, the dumping factor can be kept constant.

Specifically, the current generating means is a current mirror circuit that has, on an input side thereof, a first field effect transistor for providing first conductance in accordance with a supplied first bias current, and on an output side thereof, a second field effect transistor for providing second conductance at the given rate to the first conductance in accordance with a supplied second bias current, accepts the first current as an input and outputs the second current. In this case, the circuit element is the first field effect transistor, and the bias controlling means changes the first and second bias currents and the charge current in accordance with the bias control signal.

Specifically, the circuit element is a first voltage-current converter with first conductance for converting the first voltage into the first current, and the current generating means is a second voltage-current converter with second conductance at the given rate to the first conductance for converting the first voltage into the second current. The first and second voltage-current converters are respectively capable of changing the first and second conductance. The bias controlling means changes the first and second conductance and the charge current in accordance with the bias control signal.

Preferably, the bias control signal is generated on the basis of the output signal from the loop filter. Thus, the conductance of the circuit element and the charge current of the loop filter can be appropriately changed on the basis of the output of the loop filter. In other words, a feedback system capable of appropriately changing its response characteristic on the basis of the output of the loop filter can be realized.

Preferably, the adding means in the loop filter is an operational amplifier, and the bias controlling means changes a band characteristic of the operational amplifier in accordance with the bias control signal.

BEST MODE FOR CARRYING OUT THE INVENTION

Preferred embodiments of the invention will now be described with reference to the accompanying drawings.

(Embodiment 1)

Figure 1:
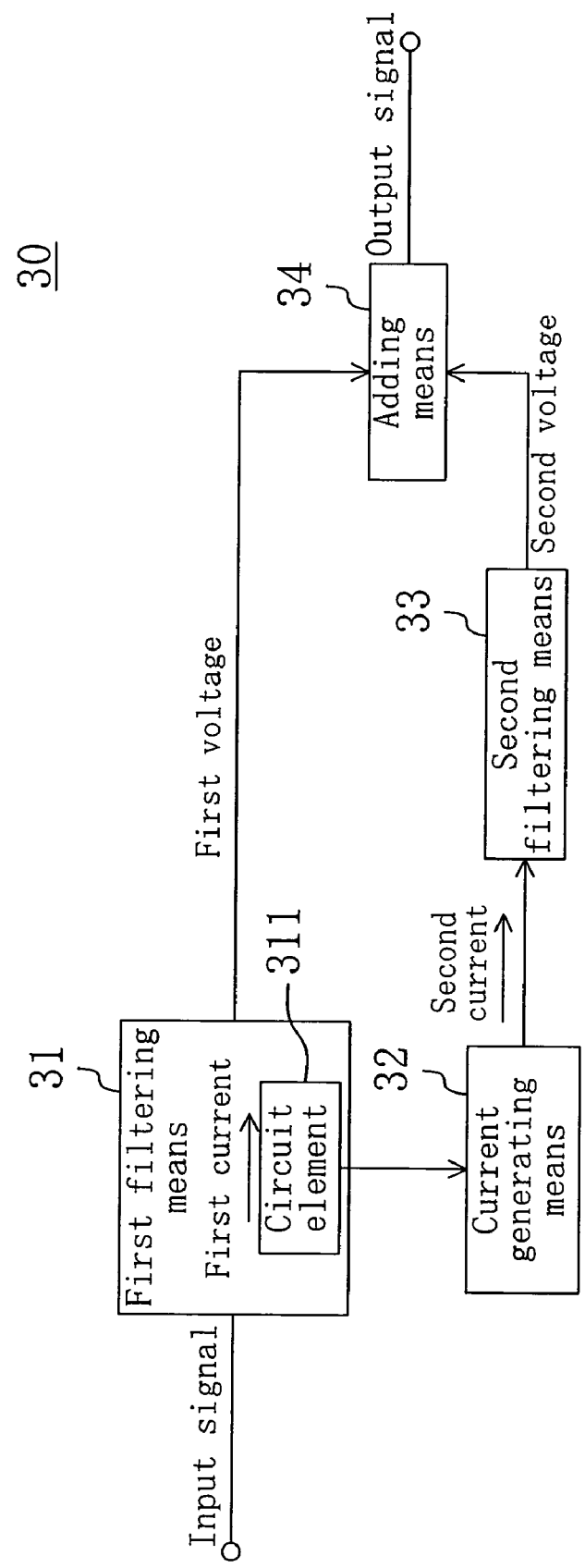
FIG. 1 is a diagram for showing the architecture of a low-pass filter of this invention.
Figure 2:
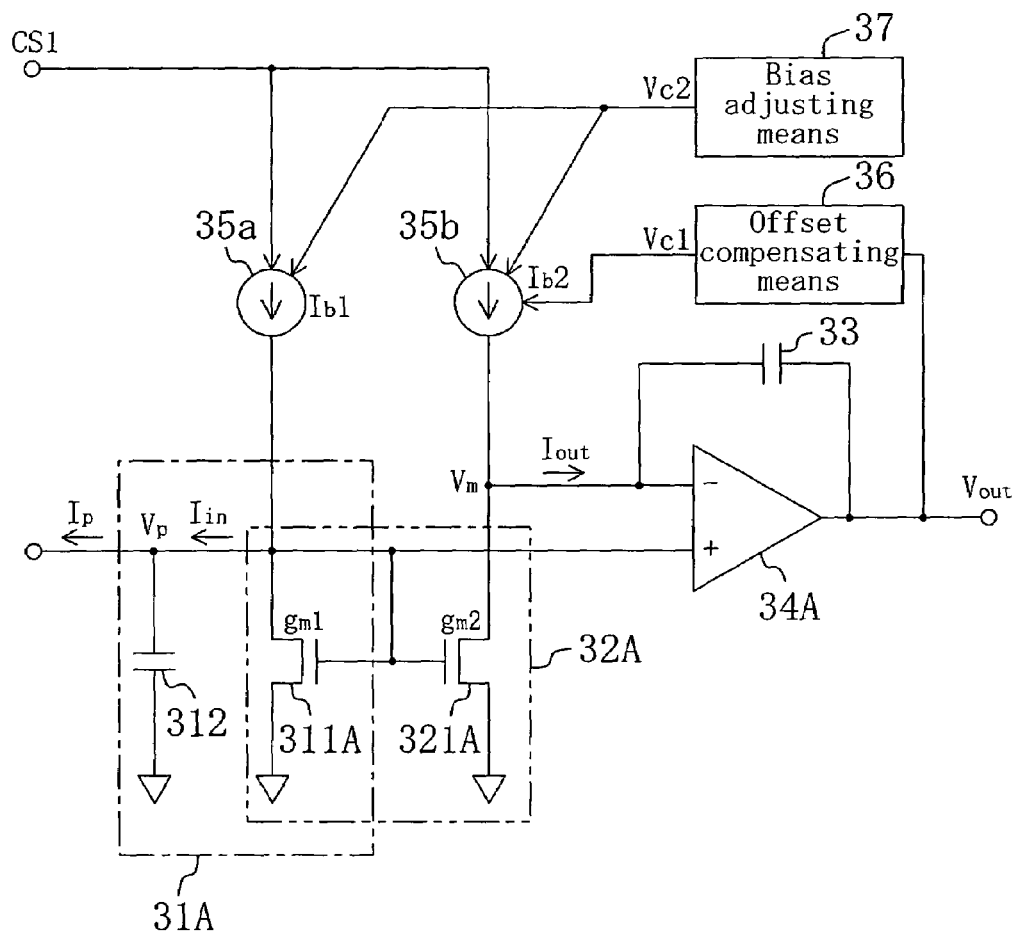
FIG. 2 is a circuit diagram of a low-pass filter according to Embodiment 1 of the invention.

FIG. 2 shows a low-pass filter according to Embodiment 1 of the invention. The low-pass filter 30A of this embodiment is a second-order active filter including a capacitive element 312, a current mirror circuit 32A, a capacitive element 33, an operational amplifier 34A, current sources 35a and 35b, offset compensating means 36 and bias adjusting means 37. The low-pass filter 30A can be constructed as a semiconductor integrated circuit.

Figure 32:
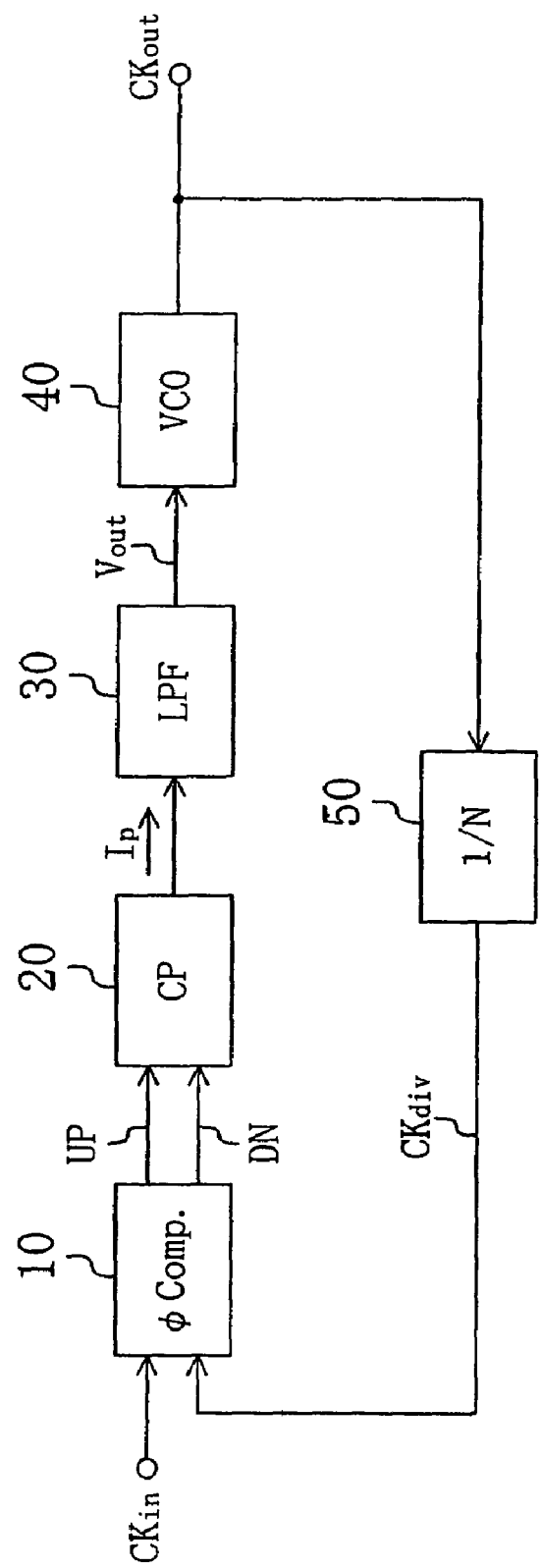
FIG. 32 is a diagram for showing the architecture of a general PLL.

The low-pass filter 30A is applicable to, for example, the PLL shown in FIG. 32. In this application, the low-pass filter 30A accepts, as an input, a charge current Ip (whereas in a reverse direction to that shown in FIG. 32) from the charge pump circuit 20 and outputs a control voltage Vout, so as to control the voltage controlled oscillator 40.

The current mirror circuit 32A corresponds to the current generating means of this invention. The current mirror circuit 32A has, on its input side, a field effect transistor 311A serving as a first semiconductor element and, on its output side, a field effect transistor 321A serving as a second semiconductor element, and accepts a first current Iin as an input and outputs a second current Iout. The transistor 311A provides, as its electric characteristic, first conductance gm1 in accordance with a first bias current Ib1 supplied from the current source 35a. Similarly, the transistor 321A provides, as its electric characteristic, second conductance gm2 at a given rate to the first conductance gm1 in accordance with a second bias current Ib2 supplied from the current source 35b. In this embodiment, this given rate corresponds to the mirror ratio of the current mirror circuit 32A.

The capacitive element 312 forms, together with the transistor 311A, the first filtering means 31A of this invention. The transistor 311A corresponds to the circuit element included in the first filtering means of this invention. The first filtering means 31A accepts, as an input, a current Ip that is an input signal to the low-pass filter 30A and outputs a first voltage Vp.

The capacitive element 33 corresponds to the second filtering means of this invention. The capacitive element 33 accepts, as an input, the second current Iout output from the current mirror circuit 32A and outputs a second voltage. In the architecture of FIG. 2, the second voltage corresponds to a voltage difference between a voltage Vout and a voltage Vm.

The operational amplifier 34A corresponds to the adding means of this invention. The operational amplifier 34A has the capacitive element 33 in its negative feedback portion, accepts, as an input, the first voltage Vp at its non-inverting input terminal and outputs the third voltage Vout as the output signal of the low-pass filter 30A. In other words, the operational amplifier 34A forms, together with the capacitive element 33, an active type integrator, which integrates the second current Iout accepted as an input and outputs the third voltage Vout.

The offset compensating means 36 and the bias adjusting means 37 will be described in detail later.

Now, the operation of the low-pass filter 30A having the aforementioned architecture will be described. In this description, it is assumed that the offset compensating means 36 and the bias adjusting means 37 are not provided.

The current Ip supplied to the low-pass filter 30A is subjected to the first filtering processing by the first filtering means 31A, so as to output the first voltage Vp. At this point, the first current Iin flowing to the input side of the current mirror circuit 32A is mirrored to its output side. When it is herein assumed that the first conductance gm1 and the second conductance gm2 are equal, namely, the mirror ratio is "1", the second current Iout corresponding to an inverted current of the first current Iin flows to the output side of the current mirror circuit 32A. The second current Iout is subjected to the second filtering processing by the capacitive element 33, so as to output the second voltage. Since the inverting input terminal and the non-inverting input terminal of the operational amplifier 34A have the equivalent potential through the so-called virtual short, the operational amplifier 34A outputs the third voltage Vout obtained by adding the second voltage to the first voltage Vp.

Also, a common bias control signal CS1 is supplied to the current sources 35a and 35b, and the first and second bias currents Ib1 and Ib2 are changed on the basis of this bias control signal CS1. When the first and second bias currents Ib1 and Ib2 are changed, the first and second conductance gm1 and gm2 of the transistors 311A and 321A are also changed. In other words, the low-pass filter 30A can dynamically vary its filtering characteristic in accordance with the bias control signal CS1 without using a resistor ladder circuit.

Next, the transfer characteristic of the low-pass filter 30A equivalent to that of a general second-order active filter will be described.

Figure 3:
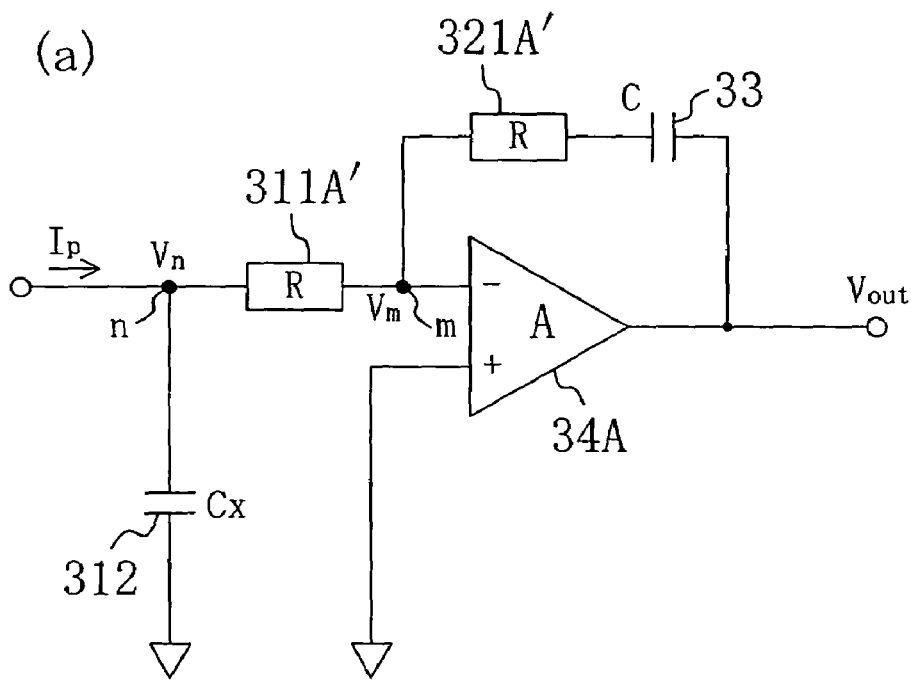
FIGS. 3(a) and 3(b) are diagrams for explaining the transfer characteristic of the low-pass filter of FIG 2.
Figure 3:
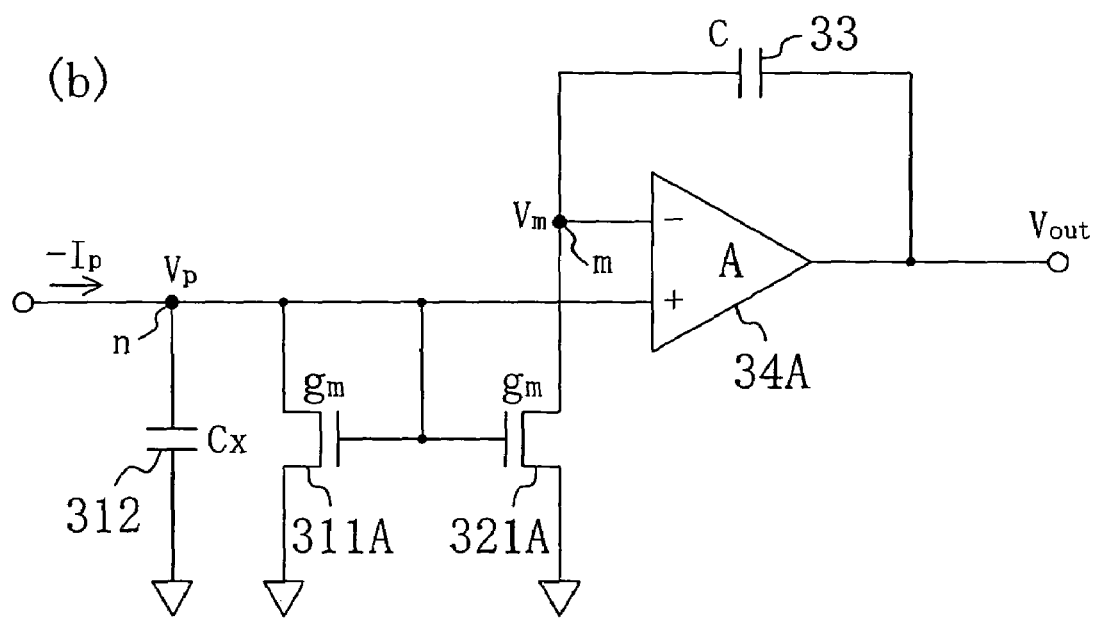
Figure 33:
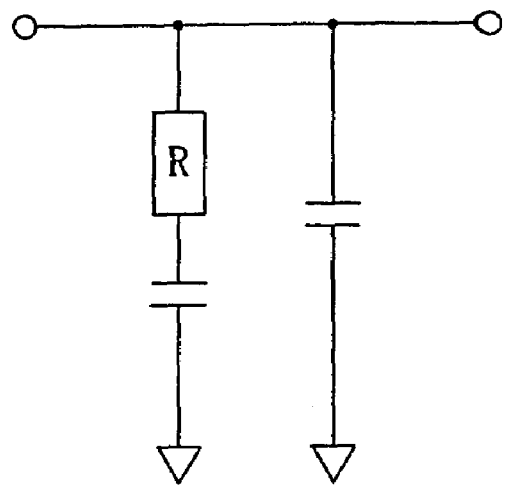
FIGS. 33(a) and 33(b) are circuit diagrams of general loop filters.
Figure 33:
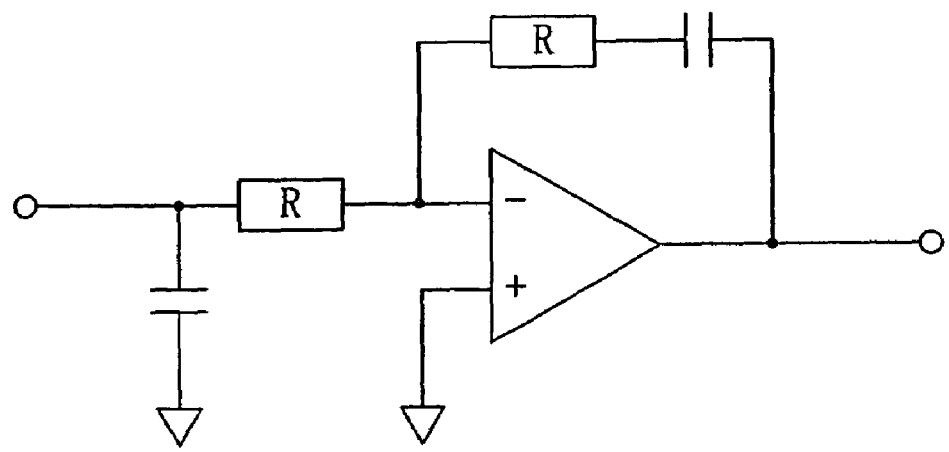
Figure 34:
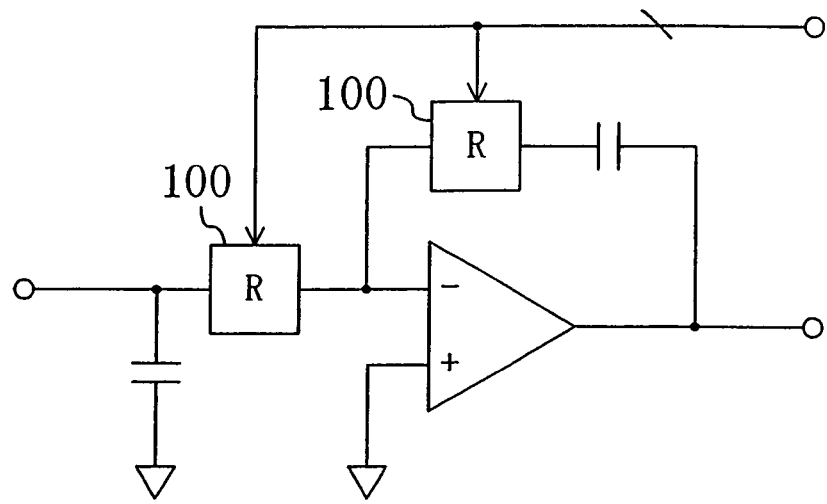
FIGS. 34(a) and 34(b) are circuit diagrams of a conventional loop filter variable in its filtering characteristic.
Figure 34:
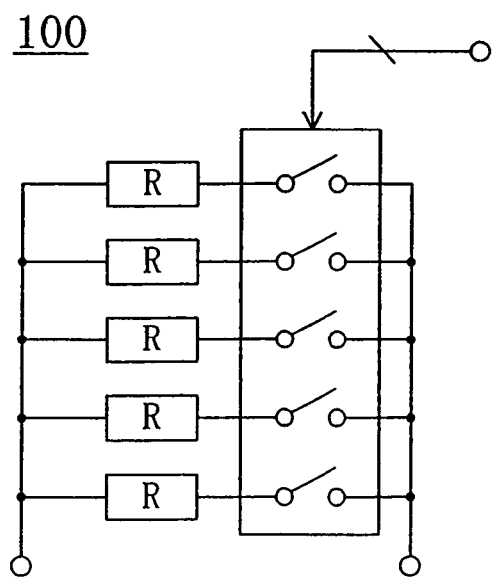
Figure 35:
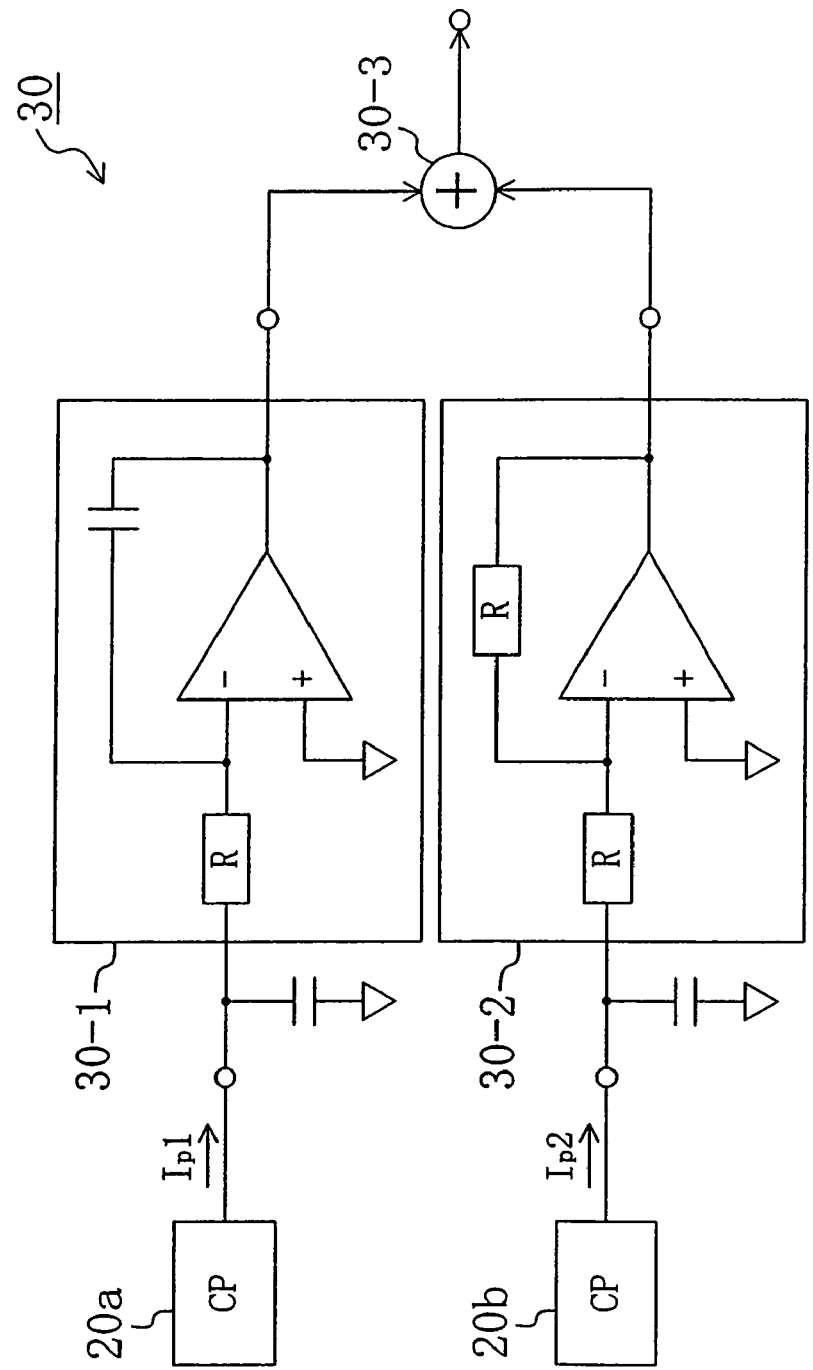
FIG. 35 is a circuit diagram of another conventional loop filter variable in its filtering characteristic.

FIG. 3 is a diagram for explaining the transfer characteristic of the low-pass filter 30A. FIG. 3(a) again shows the general second-order active filter of FIG. 33(b). It is herein assumed that both of resistive elements 311A' and 321A' have a resistance value R, that a capacitive element 312 has a capacitance value Cx, that a capacitive element 33 has a capacitance value C, and that an operational amplifier 34A has an amplification factor A. Under these conditions, nodal equations at nodes n and m and the voltage Vout are respectively represented by the following equations (1) through (3):

$$-Ip + Vn \cdot sCx + \frac{Vn - Vm}{R} = 0 \qquad (1)$$

-continued $$\frac{Vm - Vn}{R} + \frac{Vm - Vout}{R + \frac{1}{sC}} = 0 \qquad (2)$$

$$Vout = A \cdot (-Vm) \qquad (3)$$

At this point, assuming the infinity of the amplification factor A of the operational amplifier 34A, the following equation (4) can be obtained as a transfer function Vout/Ip:

$$Vout/Ip = -\frac{R \cdot sC + 1}{sC(R \cdot sCx + 1)} \qquad (4)$$

On the other hand, in the low-pass filter 30A, when it is assumed that the transistors 311A and 321A both have conductance gm, that the capacitive elements 312 and 33 have the aforementioned capacitance values and that the operational amplifier 34A has the aforementioned amplification factor, nodal equations at the nodes n and m and the voltage Vout are respectively represented by the following equations (5) through (7):

$$Ip + Vp \cdot sCx + Vp \cdot gm = 0 \qquad (5)$$

$$Vm \cdot gm + (Vm - Vout) \cdot sC = 0 \qquad (6)$$

$$Vout = A \cdot (Vp - Vm) \qquad (7)$$

At this point, assuming the infinity of the amplification factor A of the operational amplifier 34 similarly, the following equation (8) can be obtained as the transfer function Vout/Ip:

$$Vout/Ip = -\frac{\frac{sC}{gm} + 1}{sC\left(\frac{sCx}{gm} + 1\right)} \qquad (8)$$

When gm=1/R, the equation (8) is identical to the equation (4). Specifically, the low-pass filter 30A has the equivalent transfer characteristic as the general second-order active filter shown in FIG. 33(b).

Next, reduction in the circuit area of the low-pass filter 30A, and downsizing of the capacitive element 33 in particular, will be described.

Figure 4:
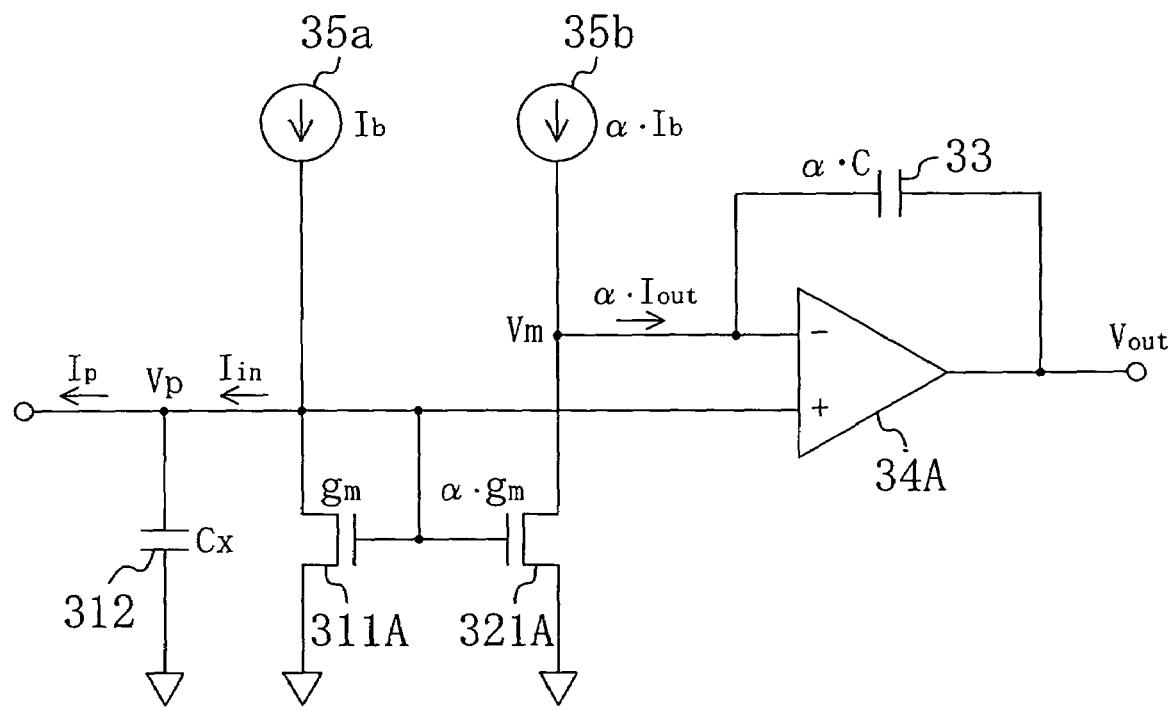
FIG. 4 is a circuit diagram obtained by changing the mirror ratio of a current mirror circuit of the low-pass filter of FIG. 2.

FIG. 4 shows a circuit configuration obtained when the mirror ratio of the current mirror circuit 32A of the low-pass filter 30A is changed. As shown in FIG. 4, the conductance rate between the transistor 311A and the transistor 321A is set to 1:α. The conductance of a transistor can be controlled by changing, for example, W/L (wherein W is a gate width and L is a gate length). Also, the rate between the first bias current and the second bias current is similarly set to 1:α. In other words, the mirror ratio of the current mirror circuit 32A is set to α.

In order to make the transfer characteristic of the low-pass filter 30A in which the mirror ratio of the current mirror circuit 32A is set to a identical to that of the original low-pass filter 30A shown in FIG. 2, it is understood from the equation (8) that the capacitance value of the capacitive element 33 should be set to α·C. Accordingly, the capacitance value of the capacitive element 33 can be reduced by setting α to a positive number smaller than 1. In the case where α is thus reduced, although the actual transfer characteristic of the low-pass filter 30A is shifted from a theoretical value obtained by the equation (8), α can be reduced at least to approximately ¹⁄₁₀ through ¹⁄₁₀₀.

Next, compensation of an offset current performed by the offset compensating means 36 will be described.

Since the low-pass filter 30A uses the current mirror circuit 32A, there disadvantageously arises an error, namely, an offset, between the first current Iin and the second current Iout in the steady state due to variations in the characteristics of the current sources 35a and 35b and the characteristics of the transistors 311A and 321A. Therefore, the offset compensating means 36 is provided for compensating the offset current. The offset compensating means 36 adjusts the second bias current Ib2 by changing, on the basis of the voltage Vout generated with the first current Iin input to the current mirror circuit 32A cut off, the bias of the current source 35b so as to make the voltage Vout zero.

Figure 5:
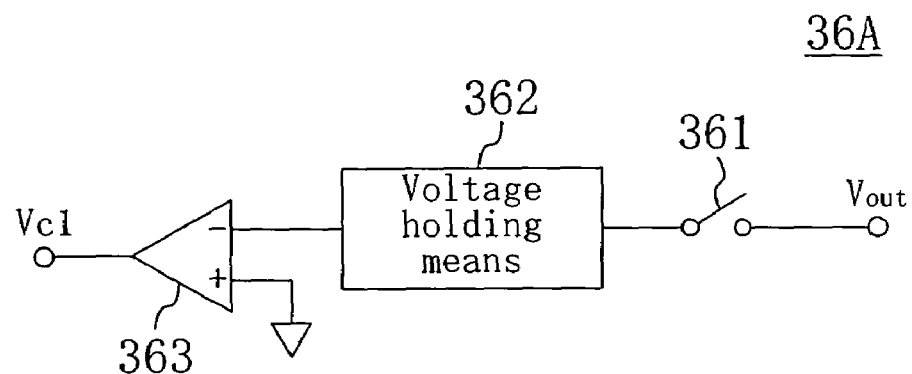
FIG. 5 is a circuit diagram of an example of offset compensating means of the low-pass filter of FIG. 2.

FIG. 5 shows a specific example of the offset compensating means. This offset compensating means 36A includes a switch 361, voltage holding means 362 and signal inverting means 363. When the switch 361 is closed with the first current Iin cut off, the voltage Vout is supplied to the voltage holding means 362, and the voltage holding means 362 holds this voltage Vout. The voltage holding means 362 can be realized by using, for example, a sample-and-hold circuit or a capacitive element simply. The voltage held by the voltage holding means 362 is inverted by the signal inverting means 363 so as to be output as a control voltage Vc1. The signal inverting means 363 can be realized by using, for example, an inverting amplifier. The control voltage Vc1 is fed back to the current source 35b to be used for adjusting the second bias current Ib2 of the current source 35b. Such a feedback loop is stabilized when the offset current is zero. When the switch 361 is opened after stabilizing the feedback loop, the low-pass filter 30A becomes usable. At this point, the voltage holding means 362 holds the voltage at which the feedback loop is stabilized, and the second bias current Ib2 is adjusted on the basis of this voltage.

Figure 6:
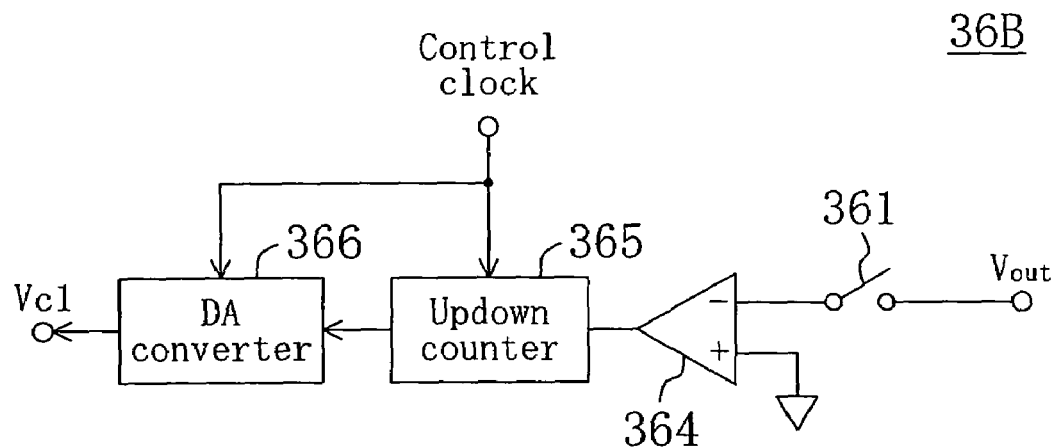
FIG. 6 is a circuit diagram of another example of the offset compensating means of the low-pass filter of FIG. 2.

The voltage held by the voltage holding means 362 is, however, varied with time due to a leakage current of the circuit. Therefore, the voltage at which the feedback loop is stabilized is held not as an analog value but as a digital value as follows:

FIG. 6 shows another specific example of the offset compensating means. This offset compensating means 36B includes a switch 361, a comparator 364, an updown counter 365 and a DA converter 366. When the switch 361 is closed with the first current Iin cut off, the voltage Vout is supplied to the comparator 364. The comparator 364 compares the voltage Vout with a reference voltage (such as a ground voltage) and outputs a supply voltage or the ground voltage in accordance with the comparison result. The updown counter 365 increments or decrements its counter value on the basis of the output of the comparator 364. The DA converter 366 converts the counter value of the updown counter 365 into an analog value of a control voltage Vc1. The updown counter 365 and the DA converter 366 perform sampling in synchronization with a common control clock. Owing to this configuration, the offset compensating means 36B holds the voltage at which the feedback loop is stabilized as the counter value, namely, a digital value.

Although the offset compensating means 36A has a disadvantage that the voltage held by the voltage holding means 362 is varied, it can be realized in a comparatively small circuit scale. On the other hand, although the circuit scale is increased, the offset compensating means 36B can compensate the offset current highly accurately. Furthermore, the accuracy in the compensation of the offset current can be further improved by increasing the bit accuracy of the DA converter 366.

Although the control voltage Vc1 is fed back to the current source 35b in the above description, it may be fed back to the current source 35a. Alternatively, both the current sources 35a and 35b can be controlled by using the control voltage Vc1. In either case, the same effect as that described above can be attained.

Figure 7:
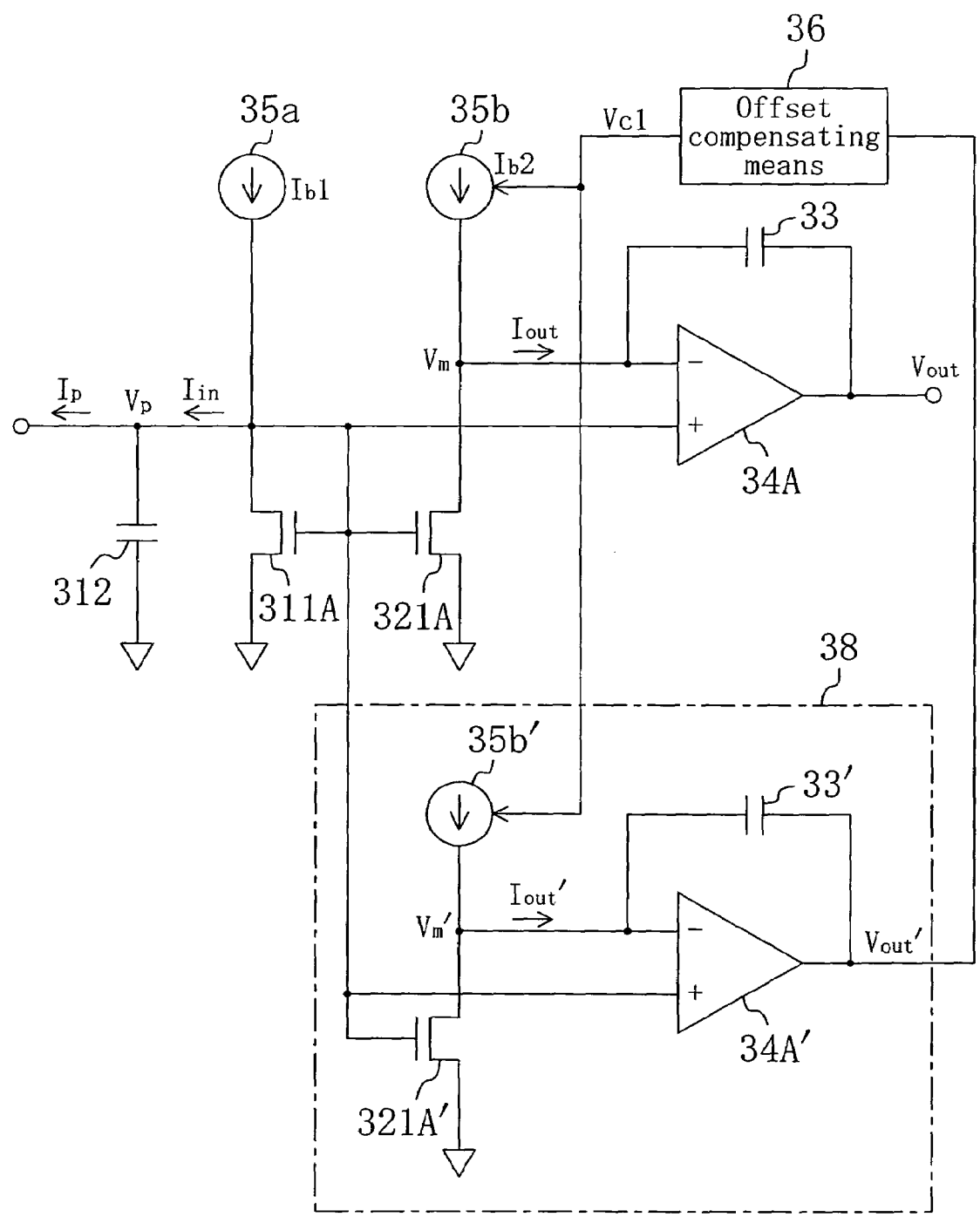
FIG. 7 is a circuit diagram of a low-pass filter including a replica circuit for offset compensation.

Alternatively, the offset current can be compensated by providing a replica circuit. FIG. 7 shows a low-pass filter provided with a replica circuit for the offset compensation. The replica circuit 38 includes a transistor 321A' corresponding to the transistor 321A, a current source 35b' corresponding to the current source 35b, a capacitive element 33' corresponding to the capacitive element 33 and an operational amplifier 34A' corresponding to the operational amplifier 34A, and accepts a first voltage Vp as an input and outputs a voltage Vout' corresponding to the third voltage Vout. Offset compensating means 36 inverts the voltage Vout' accepted as an input and outputs the inverted voltage as a control voltage Vc1. This offset compensating means 36 can be realized by using an inverting amplifier having a predetermined time constant. The control voltage Vc1 is fed back to the current source 35b' to be used for adjusting a bias current Ib2 of the current source 35b' so as to make the offset current of the replica circuit 38 zero. When this control voltage Vc1 is supplied to the current source 35b, the offset current of the current mirror circuit 32A can be also compensated. In this manner, when the replica circuit 38 is used, the offset current output can be minimized within the range of relative accuracy between the circuit elements of the low-pass filter 30A and the corresponding circuit elements included in the replica circuit 38.

As described so far, the offset compensating means 36 or the replica circuit 38 can compensate the offset current caused in the current mirror circuit 32A, so as to eliminate drift of the voltage Vout derived from the offset current. As a result, the filtering accuracy of the low-pass filter 30A can be improved.

Next, bias control performed by using the bias controlling means 37 will be described.

The first filtering means 31A of the low-pass filter 30A uses the transistor 311A as a resistive circuit element. The first conductance gm1 of the transistor 311A is determined depending upon the first bias current Ib1 supplied by the current source 35a. In general, however, the conductance of a transistor is varied in accordance with the temperature even when the bias current is constant. In other words, when the temperature is changed, the filtering characteristic is varied. In order to solve this problem, the bias controlling means 37 is provided to the low-pass filter 30A, so as to make constant the conductance gm1 and gm2 of the transistors 311A and 321A against the temperature change.

Figure 8:
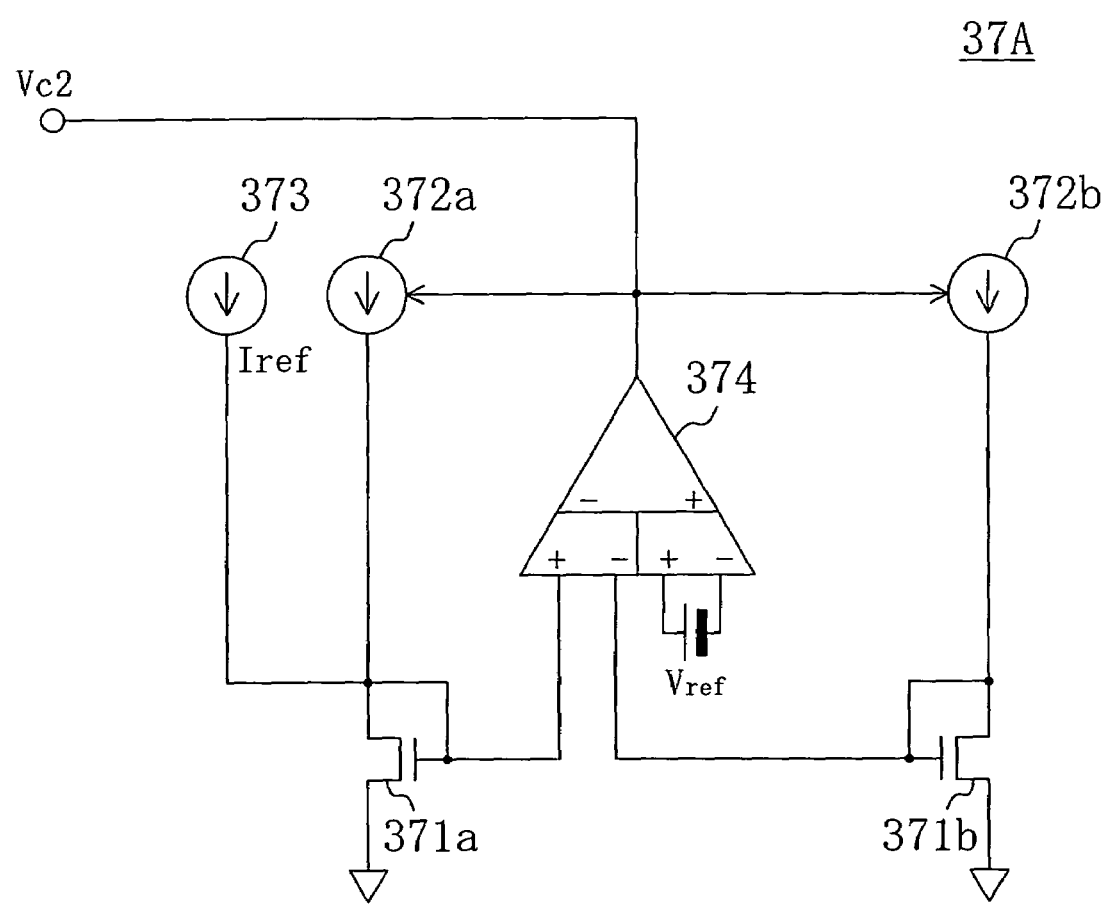
FIG. 8 is a circuit diagram of an example of bias adjusting means of the low-pass filter of FIG. 2.

FIG. 8 shows a specific example of the bias controlling means. This bias controlling means 37A includes a third transistor 371a corresponding to the transistor 311A, a fourth transistor 371b corresponding to the transistor 321A, a current source 372a corresponding to the current source 35a, a current source 372b corresponding to the current source 35b, a current source 373 for supplying an additional bias current Iref to the transistor 371a and a differential amplifier 374. The transistors 371a and 371b are both diode-connected.

The transistors 371a and 371b of the bias controlling means 37A are respectively supplied with bias currents with a current difference Iref. Thus, a voltage difference ΔV is caused between the transistors 371a and 371b. The differential amplifier 374 accepts the voltage difference ΔV as an input, and outputs a control voltage Vc2 for equalizing this voltage difference to a voltage Vref. The control voltage Vc2 is fed back to the current sources 372a and 372b to be used for adjusting the bias currents of these current sources. Owing to a feedback loop thus constructed, even when the temperature is changed, the bias currents of the current sources 372a and 372b are controlled so as to cause the voltage difference Vref in accordance with the current difference Iref, namely, so as to keep the conductance (Iref/Vref) constant. When the first and second bias currents Ib1 and Ib2 of the current sources 35a and 35b are controlled by using this control voltage Vc2, namely, in accordance with this control of the current sources 372a and 372b, the first and second conductance gm1 and gm2 provided by the transistors 311A and 321A can be kept constant against the temperature change.

Figure 9:
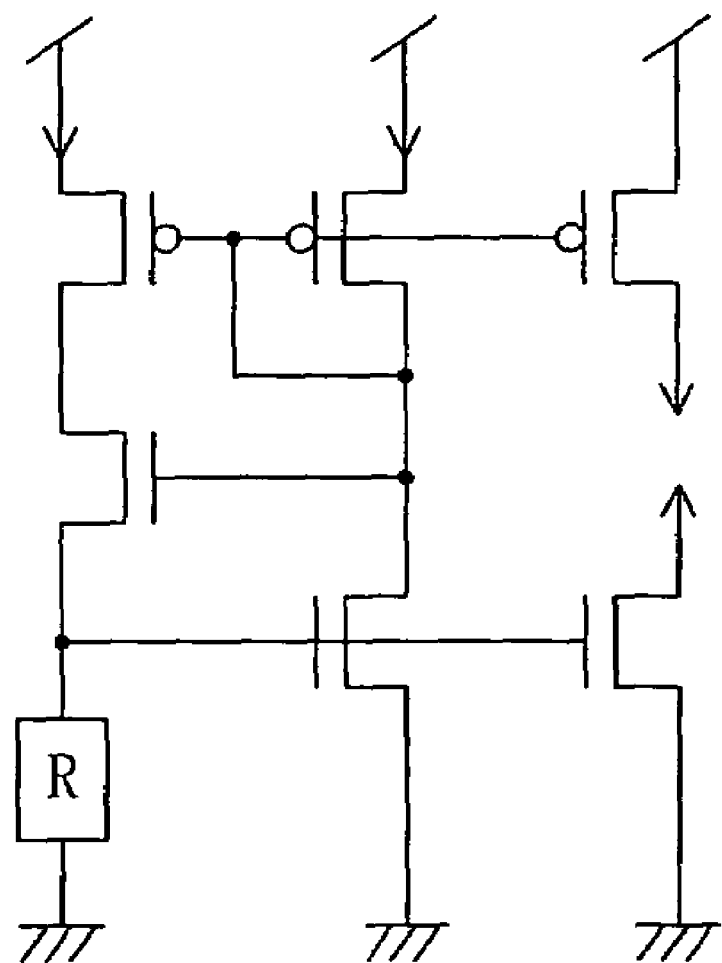
FIG. 9 is a circuit diagram of a temperature compensating circuit serving as the bias adjusting means of the low-pass filter of FIG. 2.

In general, the conductance of a transistor tends to lower as the temperature increases. Therefore, when the temperature increases, the bias current is increased, so that the conductance can be kept constant. Specifically, a temperature compensating circuit may be used as the bias controlling means. FIG. 9 shows a temperature compensating circuit serving as the bias controlling means. This temperature compensating circuit 37B is a generally used one, and is a constant current source circuit capable of supplying a constant current on the basis of a supply voltage. It is known that the output current increases in proportion to the absolute temperature in this temperature compensating circuit 37B.

In this manner, the bias controlling means 37 can keep constant the conductance of the transistors 311A and 321A against the temperature change. As a result, the frequency characteristic of the low-pass filter 30A can be kept constant regardless of the temperature.

As described so far, according to this embodiment, since the transistors 311A and 321A are used as active loads, there is no need to provide resistive elements (such as resistive elements 311A' and 321A' of the low-pass filter shown in FIG. 3(a)), and hence, the circuit area can be reduced. Furthermore, the capacitive elements 312 and 33 can be made smaller by reducing the conductance of the transistors 311A and 321A.

Furthermore, when the mirror ratio a of the current mirror circuit 32A is set to be smaller than 1, the capacitance value of the capacitive element 33 can be reduced to approximately 1/10 through 1/100. A capacitive element generally used as the capacitive element 33 has a large capacitance value of approximately 100 through 200 pF, and its area occupies, for example in a conventional PLL, approximately 50 through 70% of the whole circuit area. Since the capacitive element 33 can be downsized to approximately 1/10 through 1/100 of a conventional one in the low-pass filter 30A of this embodiment, the circuit area can be largely reduced. Also, since the second current Iout is reduced, the power consumption can be reduced. Furthermore, since a bias current flowing into the operational amplifier 34A is also reduced, the specifications required of the operational amplifier 34A, such as the through rate, can be relieved. Since a capacitive element generally used as the capacitive element 312 has a comparatively small capacitance value (of approximately 10 through 20 pF) that can be attained by using a MOS, there is no need to make a particular effort to downsize this capacitive element 312.

Furthermore, another capacitive element or a resistive element can be used in addition to the capacitive element 312 and the capacitive element 33 as the first filtering means and the second filtering means. Alternatively, a capacitive element using parasitic capacitance of the transistor 311A may be used as the capacitive element 312. Even when the low-pass filter is thus modified, the aforementioned effects are not spoiled.

Moreover, the current sources 35a and 35b can be controlled in accordance with the bias control signal CS1 in this embodiment, which is not always necessary. Furthermore, the offset compensating means 36 and the bias controlling means 37 can be omitted. These means can be provided if necessary.

Figure 10:
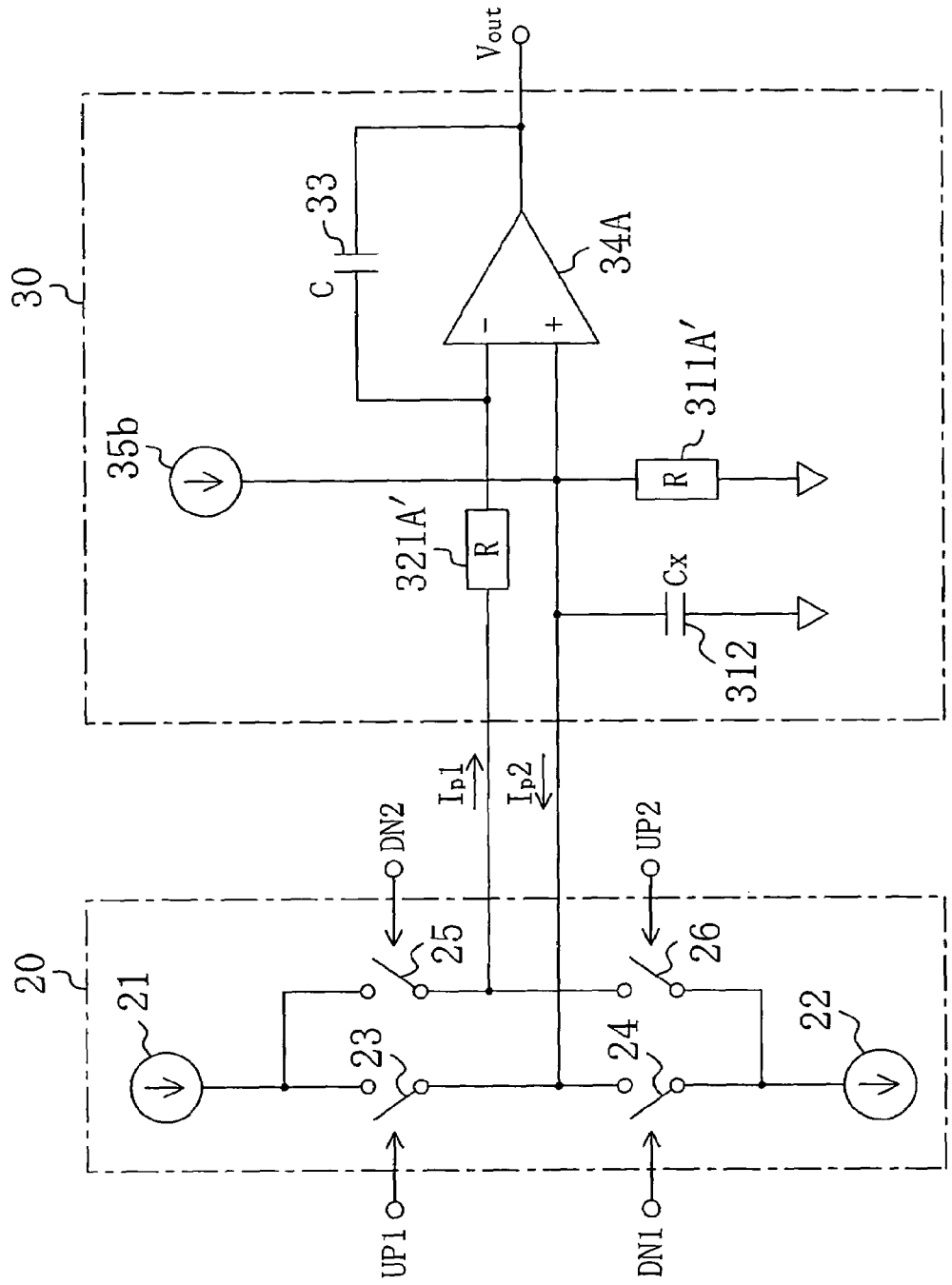
FIG. 10 is a diagram of a modification of the low-pass filter of Embodiment 1.

The current mirror circuit 32A can be replaced with a resistive element by simultaneously supplying the charge current and an inverted current obtained by inverting the charge current from the charge pump circuit to the low-pass filter. FIG. 10 shows a charge pump circuit 20 capable of simultaneously outputting a charge current Ip1 and an inverted current Ip2, and a low-pass filter 30 in which the current mirror circuit 32A of the low-pass filter 30A is replaced with resistive elements 311A' and 321A'. In the charge pump circuit 20, a pair of signals UP1 and UP2 and a pair of signals DN1 and DN2 respectively control a pair of switches 23 and 26 and a pair of switches 24 and 25. The charge current Ip1 and the inverted current Ip2 are simultaneously output from the charge pump circuit 20. On the other hand, the low-pass filter 30 accepts, as inputs, the charge current Ip1 and the inverted current Ip2 so as to be operated in the same manner as that performed by the low-pass filter 30A in which the first current Iin is input by the current mirror circuit 32A.

In a PLL including such charge pump circuit 20 and low-pass filter 30, common mode switch noise in the charge pump circuit 20 are input to the non-inverting input terminal and the inverting input terminal of the operational amplifier 34A of the low-pass filter 30, so as to be cancelled. As a result, a jitter component appearing in the PLL can be reduced.

(Embodiment 2)

Figure 11:
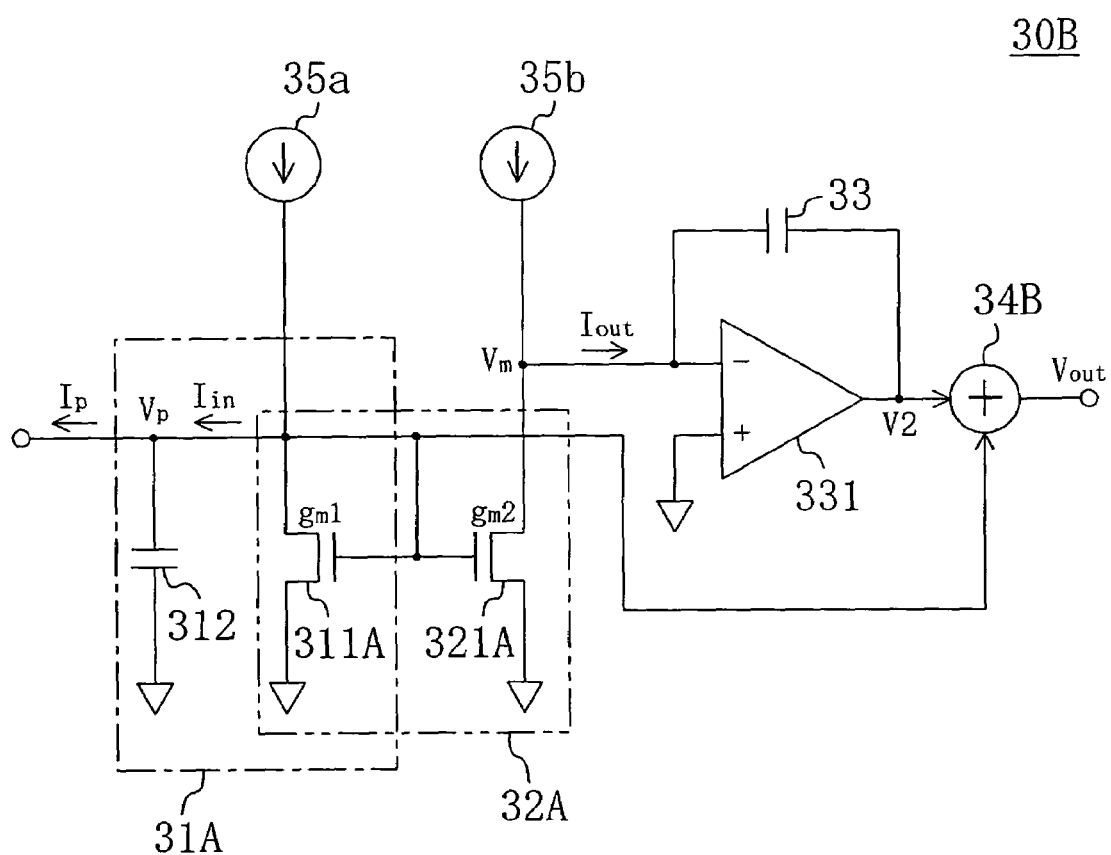
FIG. 11 is a circuit diagram of a low-pass filter according to Embodiment 2 of the invention.

FIG. 11 shows a low-pass filter according to Embodiment 2 of the invention. The low-pass filter 30B of this embodiment is obtained by modifying the adding means of the low-pass filter 30A of Embodiment 1. Herein, a difference from Embodiment 1 alone will be described. The description of elements similar to those of Embodiment 1 is omitted by referring to them with like reference numerals used in FIG. 2.

In the low-pass filter 30B, an operational amplifier 331 has the capacitive element 33 in its negative feedback portion, and accepts, as an input, a reference voltage at its non-inverting input terminal and outputs a second voltage V2. In other words, the capacitive element 33 and the operational amplifier 331 together correspond to the second filtering means in this embodiment.

An adder 34B corresponds to the adding means in this embodiment. The adder 34B accepts the first voltage Vp and the second voltage V2 as inputs, and adds these voltages to output the third voltage Vout.

In this manner, according to this embodiment, the first voltage Vp and the second voltage V2 can be individually referred to. Therefore, for example, when the adder 34B is incorporated into the voltage controlled oscillator 40 of FIG. 32 so as to individually output the first and second voltages from the low-pass filter, the voltage controlled oscillator 40 can be directly controlled.

(Embodiment 3)

Figure 12:
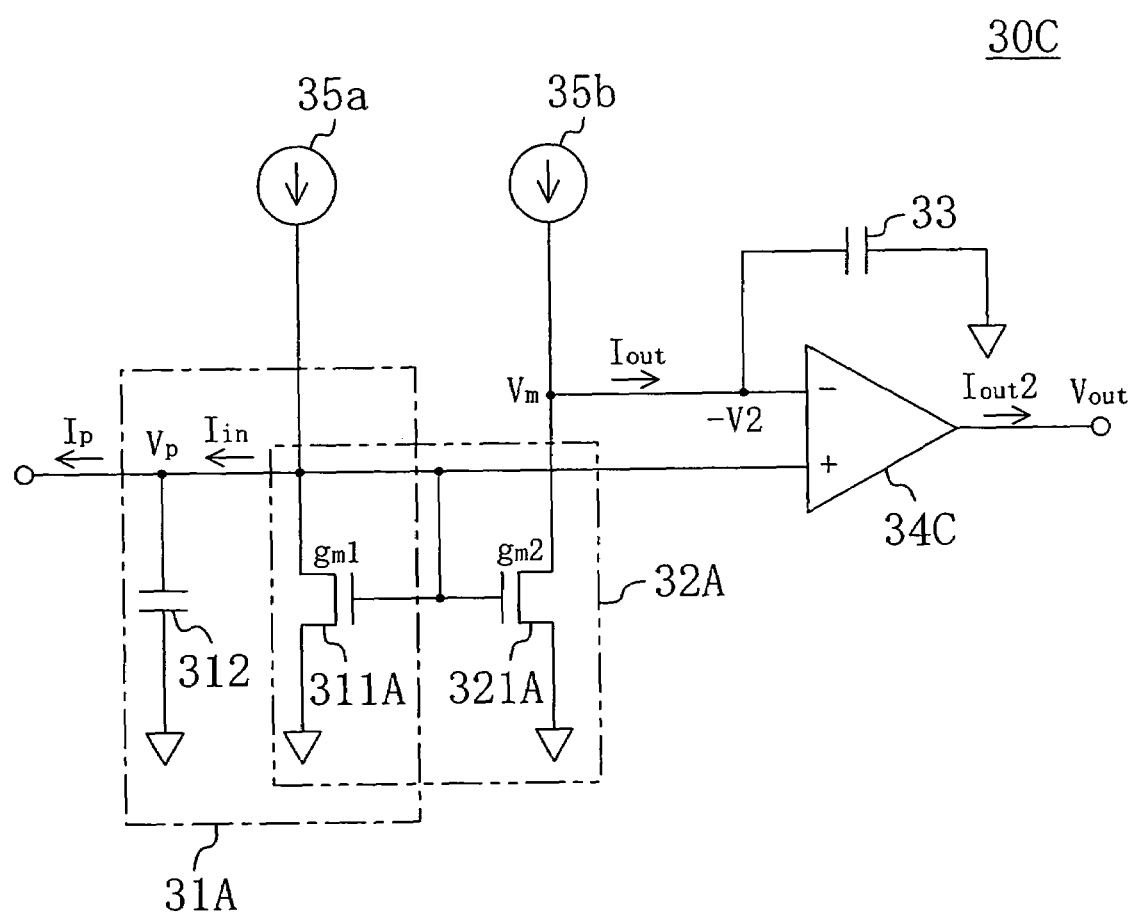
FIG. 12 is a circuit diagram of a low-pass filer according to Embodiment 3 of the invention.

FIG. 12 shows a low-pass filter according to Embodiment 3 of the invention. The low-pass filter 30C of this embodiment is obtained by modifying the adding means of the low-pass filter 30A of Embodiment 1. Herein, a difference from Embodiment 1 alone will be described. The description of elements similar to those of Embodiment 1 is omitted by referring to them with like reference numerals used in FIG. 2.

In the low-pass filter 30C, one end of the capacitive element 33 is set to a reference voltage. Thus, the capacitive element 33 accepts the second current Iout as an input and outputs a second voltage V2 with the inverted polarity.

The adding means of this embodiment is an operational transconductance amplifier (OTA) 34C. The OTA 34C accepts, as inputs, the first voltage Vp at its non-inverting input terminal and the second voltage V2 with the inverted polarity at its inverting input terminal, and outputs a third current Iout2 as the output signal of the low-pass filter 30C. The third current Iout2 has a value obtained by multiplying a differential voltage between these input terminals by predetermined conductance. In other words, the sum voltage of the first voltage Vp and the second voltage V2 is converted into a current to be output as the third current Iout2 in this embodiment.

In this manner, according to this embodiment, since the operational transconductance amplifier 34C is used as the adding means, a current signal can be output as the output signal of the low-pass filter. Also, since an operational amplifier is not used as the adding means, the circuit scale can be reduced and the power consumption can be reduced.

(Embodiment 4)

Although the low-pass filter 30A of Embodiment 1 uses the transistors 311A and 321A presumed as linear resistive elements, strictly speaking, a transistor is a nonlinear device. Accordingly, the nonlinearity of the transistors directly appears as the nonlinearity of the filtering characteristic. Therefore, when the low-pass filter 30A of Embodiment 1 is improved so as to linearize its filtering characteristic, a low-pass filter according to Embodiment 4 of the invention is obtained.

Figure 13:
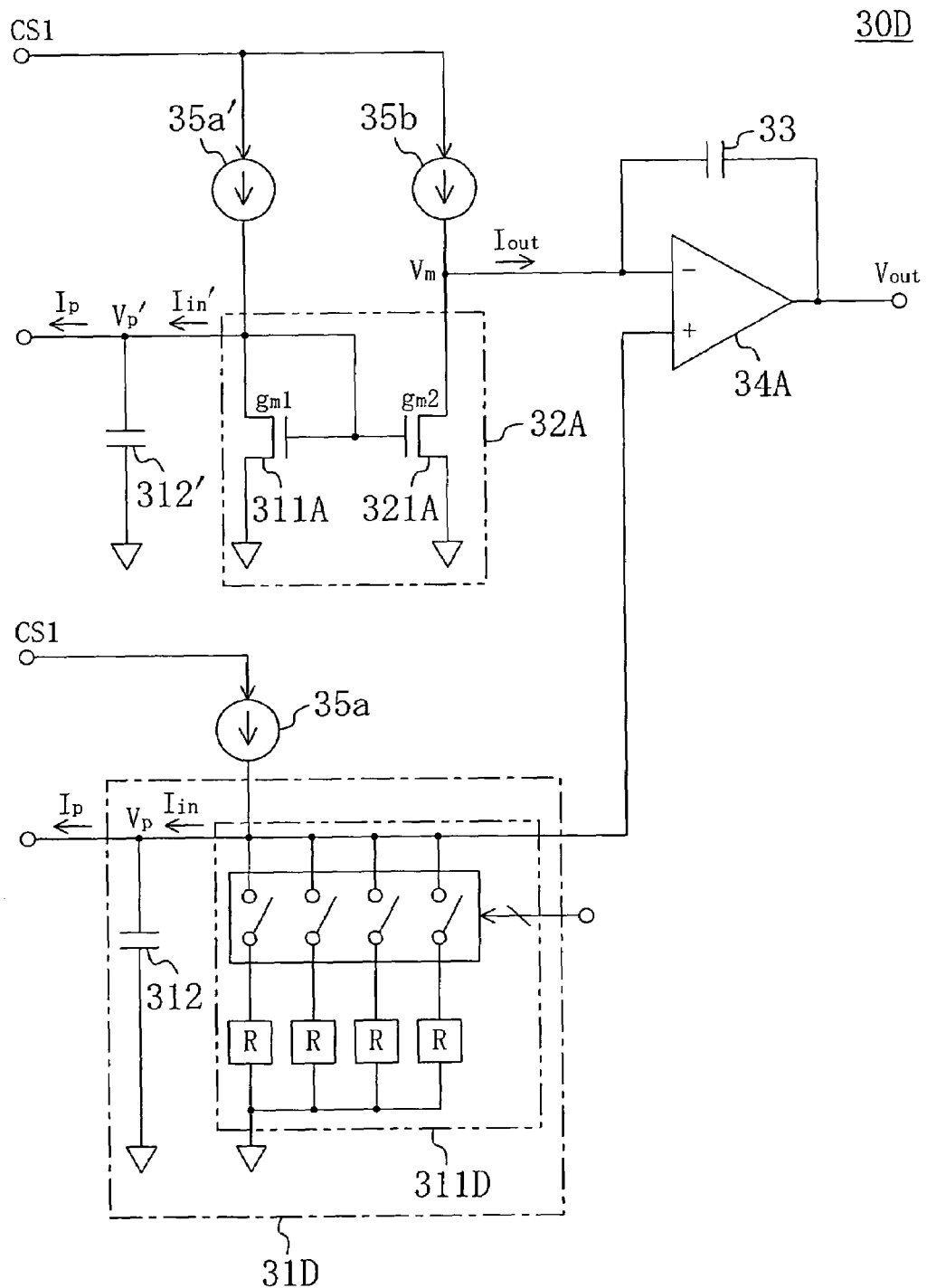
FIG. 13 is a circuit diagram of a low-pass filter according to Embodiment 4 of the invention.

FIG. 13 shows the low-pass filter of this embodiment. Herein, a difference from Embodiment 1 alone will be described. The description of elements similar to those of Embodiment 1 is omitted by referring to them with like reference numerals used in FIG. 2.

The first filtering means 31D of this low-pass filter 30D includes the capacitive element 312 and a resistor ladder circuit 311D. The resistor ladder circuit 311D corresponds to the circuit element included in the first filtering means of this invention, and has a resistance value corresponding to the first conductance gm1 of the transistor 311A of the current mirror circuit 32A. When the first conductance gm1 of the transistor 311A is changed, the resistor ladder circuit 311D changes its resistance value in accordance with the change of the first conductance gm1. Also, a bias current corresponding to the first bias current supplied to the transistor 311A is supplied to the resistor ladder circuit 311D by the current source 35a.

On the other hand, a capacitive element 312' corresponding to the capacitive element 312 is provided in parallel to the transistor 311A of the current mirror circuit 32A. Specifically, the input side of the current mirror circuit 32A is set to be equivalent to the first filtering means 31D. Therefore, when the current Ip identical to the input to the first filtering means 31D is input, the voltage on the input side of the current mirror circuit 32A becomes a voltage Vp' corresponding to the first voltage Vp, and the current flowing to the input side becomes a third current Iin' corresponding to the first current Iin. The current mirror circuit 32A accepts the third current Iin' as an input and outputs the second current Iout. Accordingly, the current mirror circuit 32A of this embodiment substantially generates the second current Iout by mirroring the first current Iin.

The first voltage Vp corresponding to the output of the first filtering means 31D is supplied to the non-inverting input terminal of the operational amplifier 34A. The operational amplifier 34A outputs the third voltage Vout obtained by adding the first voltage Vp and the second voltage.

In this manner, according to this embodiment, the resistor ladder circuit 311D is used as the resistive element in the first filtering means 31D instead of the transistors, and hence, the linearity of the filtering characteristic of the low-pass filter 30D can be improved. Furthermore, since the resistance value of the resistor ladder circuit 311D is changed in accordance with the change of the conductance of the transistor 311A, the filtering characteristic of the low-pass filter 30D can be dynamically varied.

In the case where there is no need to dynamically vary the filtering characteristic, the resistor ladder circuit 311D may be replaced with a simple resistive element. Also in such a case, the effect to improve the linearity of the filtering characteristic of the low-pass filter 30D can be attained.

(Embodiment 5)

Figure 14:
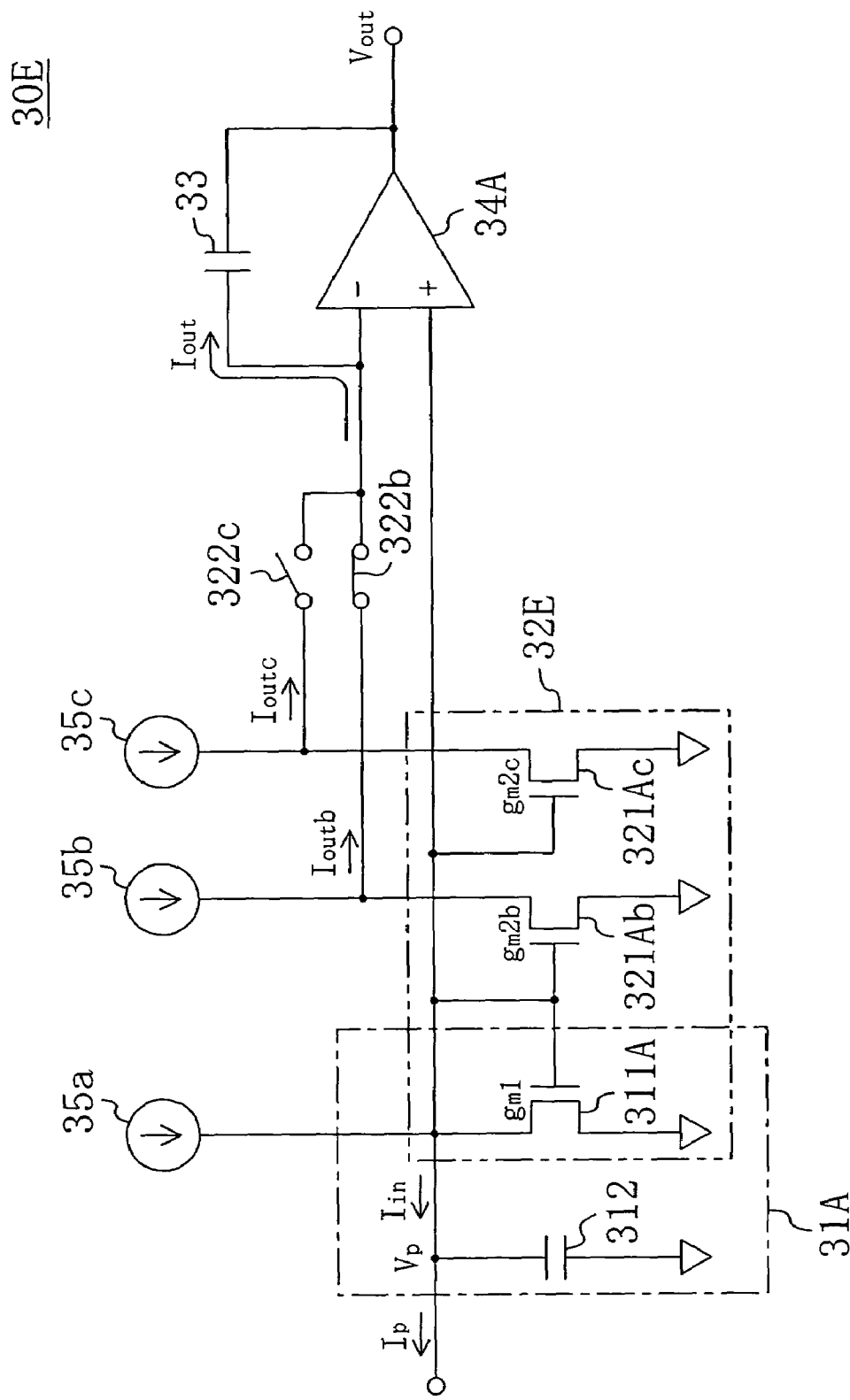
FIG. 14 is a circuit diagram of a low-pass filter according to Embodiment 5 of the invention.

FIG. 14 shows a low-pass filter according to Embodiment 5 of the invention. The low-pass filter 30E of this embodiment is obtained by improving the low-pass filter 30A of Embodiment 1 so as to be capable of switching the filtering characteristic. Herein, a difference from Embodiment 1 alone will be described. The description of elements similar to those of Embodiment 1 is omitted by referring to them with like reference numerals used in FIG. 2.

A current mirror circuit 32E of the low-pass filter 30E has, on its input side, the first transistor 311A and, on its output side, two transistors, that is, a second transistor 321Ab and a third transistor 321Ac. The transistors 321Ab and 321Ac are respectively biased by current sources 35b and 35c. When the first current Iin flows to the input side of the current mirror circuit 32E, a current Ioutb is output from the output side having the transistor 321Ab and a current Ioutc is output from the output side having the transistor 321Ac.

The low-pass filter 30E includes switches 322b and 322c for switching the outputs of the currents Ioutb and Ioutc. Therefore, a current sum of current(s) flowing through the closed one(s) of the switches 322b and 322c is supplied to the capacitive element 33 as the second current Iout.

In this manner, according to this embodiment, the filtering characteristic of the low-pass filter 30E can be switched in a stepwise manner, namely, digitally, by appropriately controlling the operations of the switches 322b and 322c. Therefore, for example, in the case where the low-pass filter 30E is used as a loop filter of a PLL, the second current Iout can be allowed to flow in a large amount for fast lead-in before the output clock is locked, and the second current Iout can be reduced for relaxing the band characteristic after it is locked.

The two transistors are provided on the output side of the current mirror circuit 32E of this embodiment, which does not limit the invention. The second through nth (wherein n is a natural number of 3 or more) transistors can be provided on the output side of the current mirror circuit.

Also, the switches for controlling the outputs of a plurality of currents from the current mirror circuit 32E may select one of the plural currents or simultaneously select a plurality of them.

(Embodiment 6)

Figure 15:
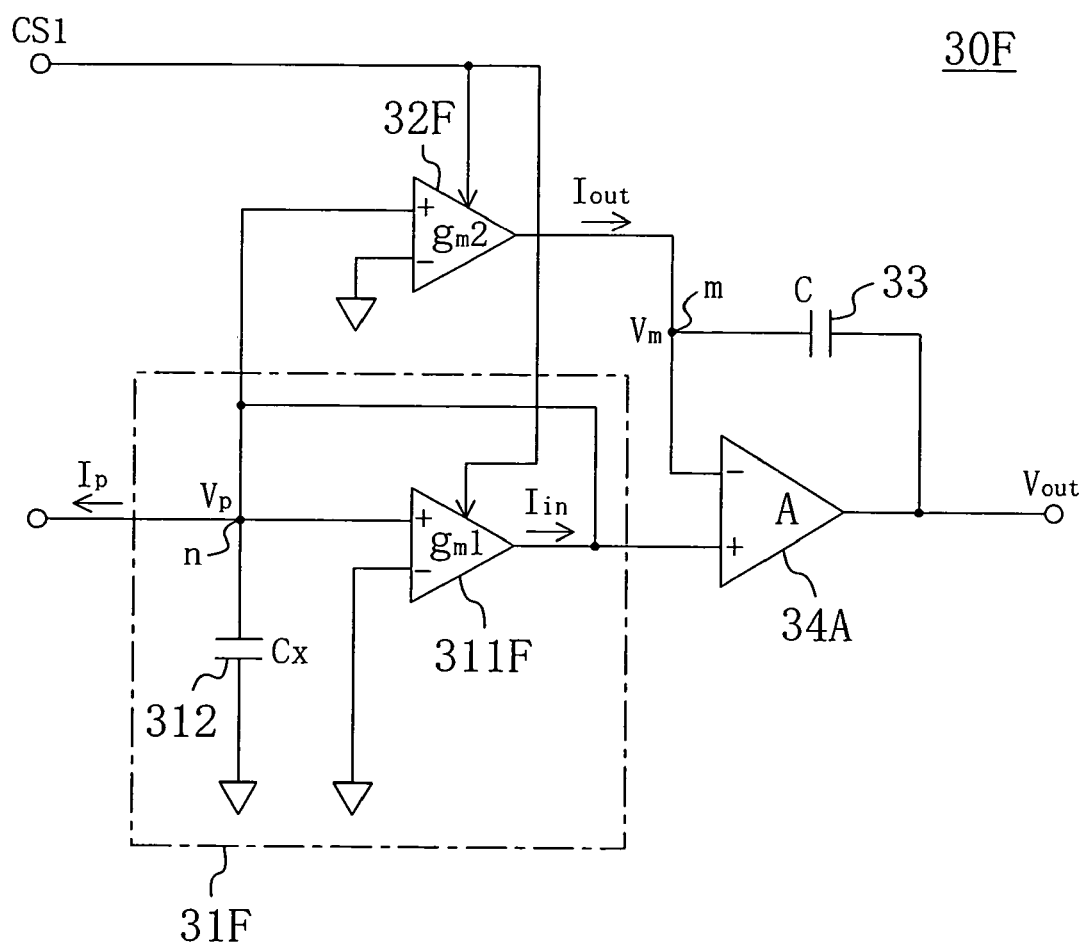
FIG. 15 is a circuit diagram of a low-pass filter according to Embodiment 6 of the invention.

FIG. 15 shows a low-pass filter according to Embodiment 6 of the invention. The low-pass filter 30F of this embodiment is obtained by replacing the current mirror circuit 34A of the low-pass filter 30A of Embodiment 1 with a first voltage-current converter 311F and a second voltage-current converter 32F. Herein, a difference from Embodiment 1 alone will be described. The description of elements similar to those of Embodiment 1 is omitted by referring to them with like reference numerals used in FIG. 2.

The first voltage-current converter 311F corresponds to the transistor 311A and the current source 35a of the low-pass filter 30A of Embodiment 1. The first voltage-current converter 311F provides the first conductance gm1 equal to that of the transistor 311A, and converts the first voltage Vp into the first current Iin. The first conductance gm1 can be changed in accordance with the bias control signal CS1. The first voltage-current converter 311F corresponds to the circuit element included in the first filtering means of this invention, and forms, together with the capacitive element 312, the first filtering means 31F.

The second voltage-current converter 32F corresponds to the transistor 321A and the second current source 35b of the low-pass filter 30A of Embodiment 1. The second voltage-current converter 32F corresponds to the current generating means of this invention, provides the second conductance gm2 equal to that of the transistor 321A and converts the first voltage Vp into the second current Iout. The second conductance gm2 can be changed in accordance with the bias control signal CS1.

The transfer characteristic of the low-pass filter 30F having this architecture is represented by the expression (8) similar to that of the low-pass filter 30A of Embodiment 1. Also, its operation is similar to that of the low-pass filter 30A. Accordingly, when the second conductance gm2 of the second voltage-current converter 32F is set to be smaller than the first conductance gm1 of the first voltage-current converter 311F, the capacitive element 33 can be downsized, so that the circuit area can be largely reduced.

Also, the voltage-current converters 311F and 32F are changed in the first and second conductance gm1 and gm2 in accordance with the common bias control signal CS1. Therefore, the filtering characteristic of the low-pass filter 30F can be dynamically varied.

In this manner, according to this embodiment, since the first voltage-current converter 311F and the second voltage-current converter 32F are used as active loads, there is no need to provide a resistive element, resulting in reducing the circuit area. Also, when the conductance of the voltage-current converters 311F and 32F are reduced, the capacitive elements 312 and 33 can be further downsized. Furthermore, when the second conductance gm2 of the second voltage-current converter 32F is set to be smaller than the first conductance gm1 of the first voltage-current converter 311F, the capacitive element 33 can be downsized with the filtering characteristic kept constant.

Moreover, the low-pass filter 30F of this embodiment does not use a current mirror circuit as the current generating means. Therefore, as compared with the case where a current mirror circuit is used, the offset current is minimally caused, so that a more accurate filtering characteristic can be attained.

(Embodiment 7)

Figure 16:
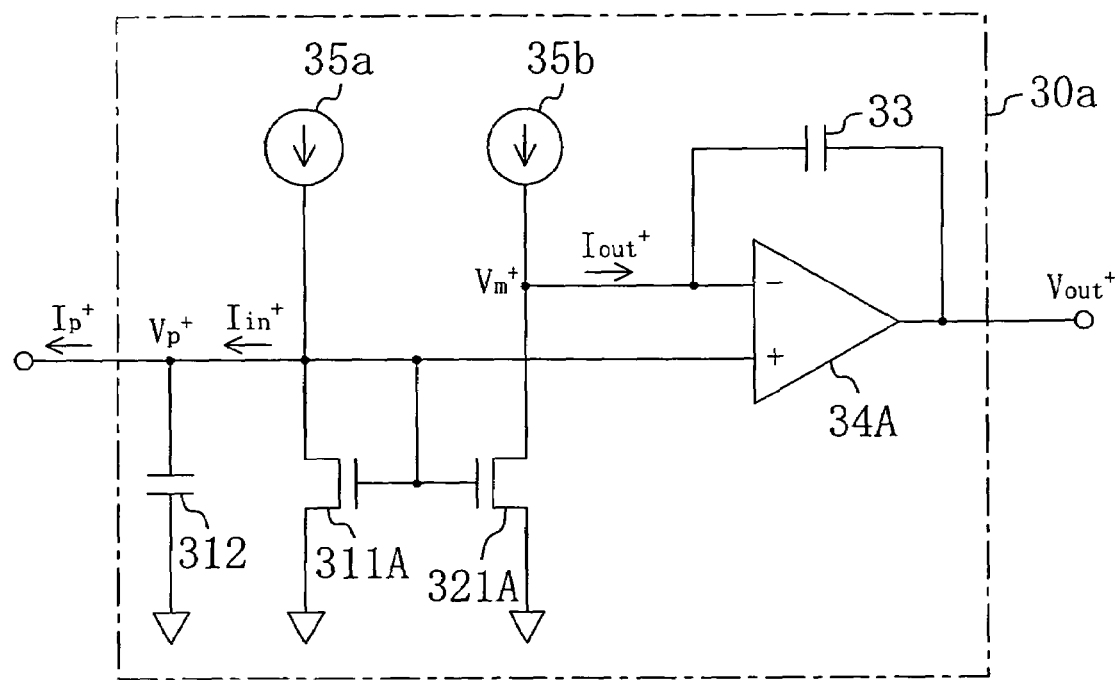
FIG. 16 is a circuit diagram of a low-pass filter according to Embodiment 7 of the invention.
Figure 16:
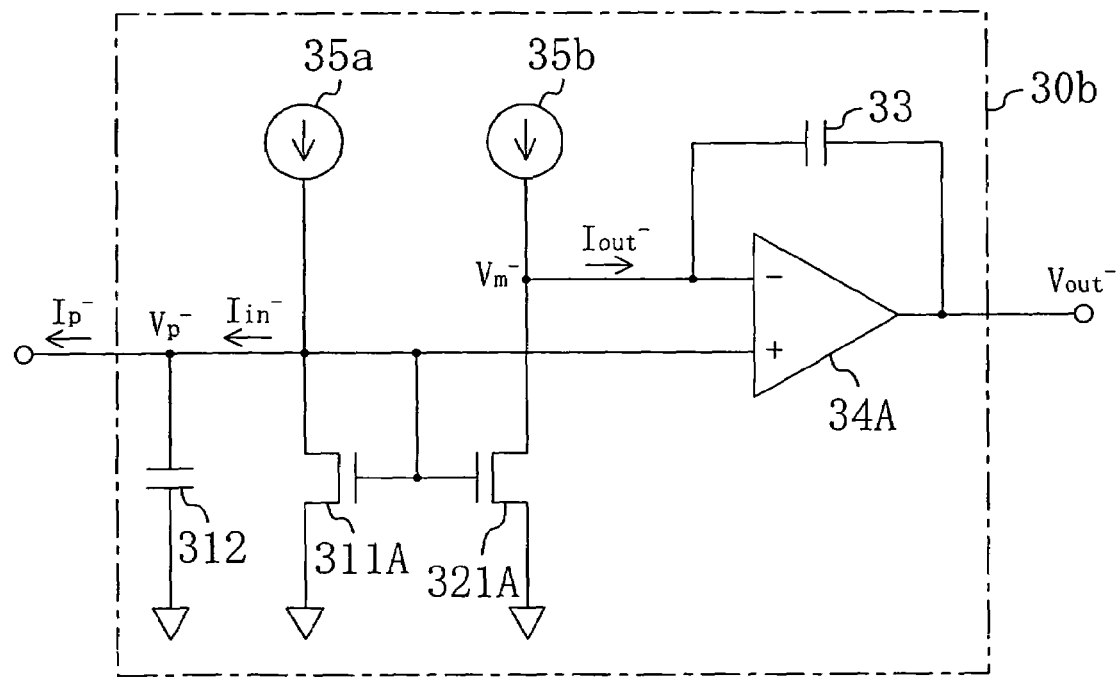

FIG. 16 shows a low-pass filter according to Embodiment 7 of the invention. The low-pass filter 30G of this embodiment includes a first low-pass filter unit 30a and a second low-pass filter unit 30b, accepts, as an input, a differential signal between a current $Ip^+$, that is, a first input signal, and a current $Ip^-$, that is, a second input signal, and outputs a differential signal between a voltage $Vout^+$, that is, a first output signal, and a voltage $Vout^-$, that is, a second output signal.

The low-pass filter 30G employs, for the first and second low-pass filter units 30a and 30b, the architecture equivalent to that of the low-pass filter 30A of Embodiment 1. The first low-pass filter unit 30a accepts the current $Ip^+$ as an input and outputs the voltage $Vout^+$. The second low-pass filter unit 30b accepts the current $Ip^-$ as an input and outputs the voltage $Vout^-$. The architecture and the operation of each of the first and second low-pass filter units 30a and 30b are not described in this embodiment because they have already been described in Embodiment 1.

In this manner, according to this embodiment, since the differential signals are used as the input and output signals of the low-pass filter, resistance against common mode source noise can be improved. Also, since the low-pass filter 30A of Embodiment 1 is employed as the first and second low-pass filter units 30a and 30b, the capacitive element 33 in each of the first and second low-pass filter units 30a and 30b can be downsized, so that the circuit area of the whole low-pass filter 30G can be largely reduced.

Each of the first and second low-pass filter units 30a and 30b is not limited to the low-pass filter 30A of Embodiment 1, but any low-pass filters having the equivalent filtering characteristics can be employed as them. Accordingly, any of the low-pass filters 30A through 30F of Embodiments 1 through 6 can be used as any of the first and second low-pass filter units 30a and 30b. Also, when the low-pass filter of this invention is employed as at least one of the first and second low-pass filter units 30a and 30b, the effect to reduce the circuit area of the low-pass filter 30G can be attained.

(Embodiment 8)

Figure 17:
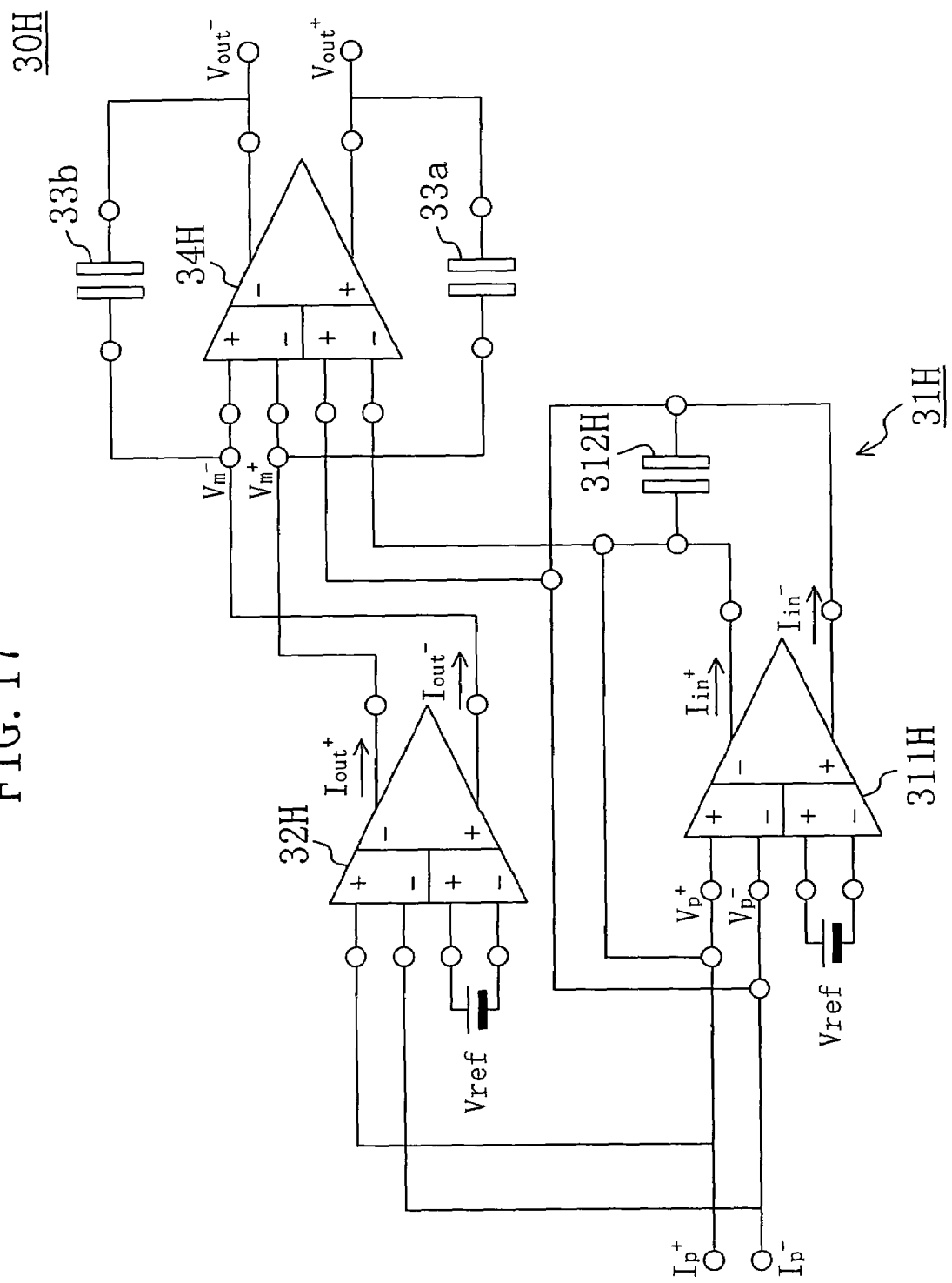
FIG. 17 is a circuit diagram of a low-pass filter according to Embodiment 8 of the invention.

FIG. 17 shows a low-pass filter according to Embodiment 8 of the invention. Also the low-pass filter 30H of this embodiment accepts, as an input, a differential signal between a current $Ip^+$, that is, a first input signal, and a current $Ip^-$, that is, a second input signal, and outputs a differential signal between a voltage $Vout^+$, that is, a first output signal, and a voltage $Vout^-$, that is, a second output signal. The low-pass filter 30H is obtained by differentiating the low-pass filter 30F of Embodiment 6 in particular.

A first differential voltage-current converter 311H corresponds to the circuit element included in the first filtering means of this invention. The first differential voltage-current converter 311H accepts, as a first voltage, a voltage difference between a voltage $Vp^+$ and a voltage $Vp^-$, and outputs, as first currents, a current $Iin^+$ and a current $Iin^-$. The amplitudes of the current $Iin^+$ and the current $Iin^-$ are determined depending upon first conductance of the first differential voltage-current converter 311H. The first differential voltage-current converter 311H forms, together with a capacitive element 312H, the first filtering means 31H.

A second differential voltage-current converter 32H corresponds to the current generating means of this invention. The second differential voltage-current converter 32H accepts, as the first voltage, the voltage difference between the voltage $Vp^+$ and the voltage $Vp^-$, and outputs, as second currents, a current $Iout^+$ and a current $Iout^-$. The amplitudes of the currents $Iout^+$ and the current $Iout^-$ are determined depending upon second conductance of the second differential voltage-current converter 32H. The second conductance is at a given rate to the first conductance of the first differential voltage-current converter 311H.

Capacitive elements 33a and 33b correspond to the second filtering means of this invention. The capacitive elements 33a and 33b respectively accept, as inputs, the current $Iout^+$ and the current $Iout^-$ generated by the second differential voltage-current converter 32H, and output a second voltage. In this case, the second voltage corresponds to a voltage difference between a difference between the voltage $Vout^-$ and a voltage $Vm^-$ and a difference between the voltage $Vout^+$ and a voltage $Vm^+$.

A differential operational amplifier 34H corresponds to the adding means of this invention. The differential operational amplifier 34H has the capacitive elements 33a and 33b in its negative feedback portions, accepts, as an input, the voltage difference between the voltage $Vp^+$ and the voltage $Vp^-$ at its non-inverting input terminal, and outputs the voltage difference between the voltage $Vout^+$ and the voltage $Vout^-$ as an output signal of the low-pass filter 30H.

In this manner, according to this embodiment, since the differential signals are used as the input and output signals of the low-pass filter, the resistance against common mode source noise can be improved. Also, when the second conductance of the second differential voltage-current converter 32H is set to be smaller than the first conductance of the first differential voltage-current converter 311H, the capacitive elements 33a and 33b can be downsized. As a result, the circuit area of the low-pass filter 30H can be largely reduced.

(Embodiment 9)

The low-pass filter 30A of FIG. 2 uses the current mirror circuit 32A as means for transferring charge. In general, however, a leakage current, namely, an offset current, is caused in a current mirror circuit due to variation in the characteristics of transistors and the like disposed on the input side and the output side of the current mirror circuit. Therefore, in some cases, it is necessary to provide the offset compensating means 36 as shown in FIG. 2 as described above.

As the means for transferring charge, a switched capacitor circuit can be used other than a current mirror circuit. An offset current is not caused in a switched capacitor circuit differently from a current mirror circuit. Therefore, a switched capacitor circuit is used as the means for transferring charge instead of a current mirror circuit for constructing a low-pass filter.

Figure 18:
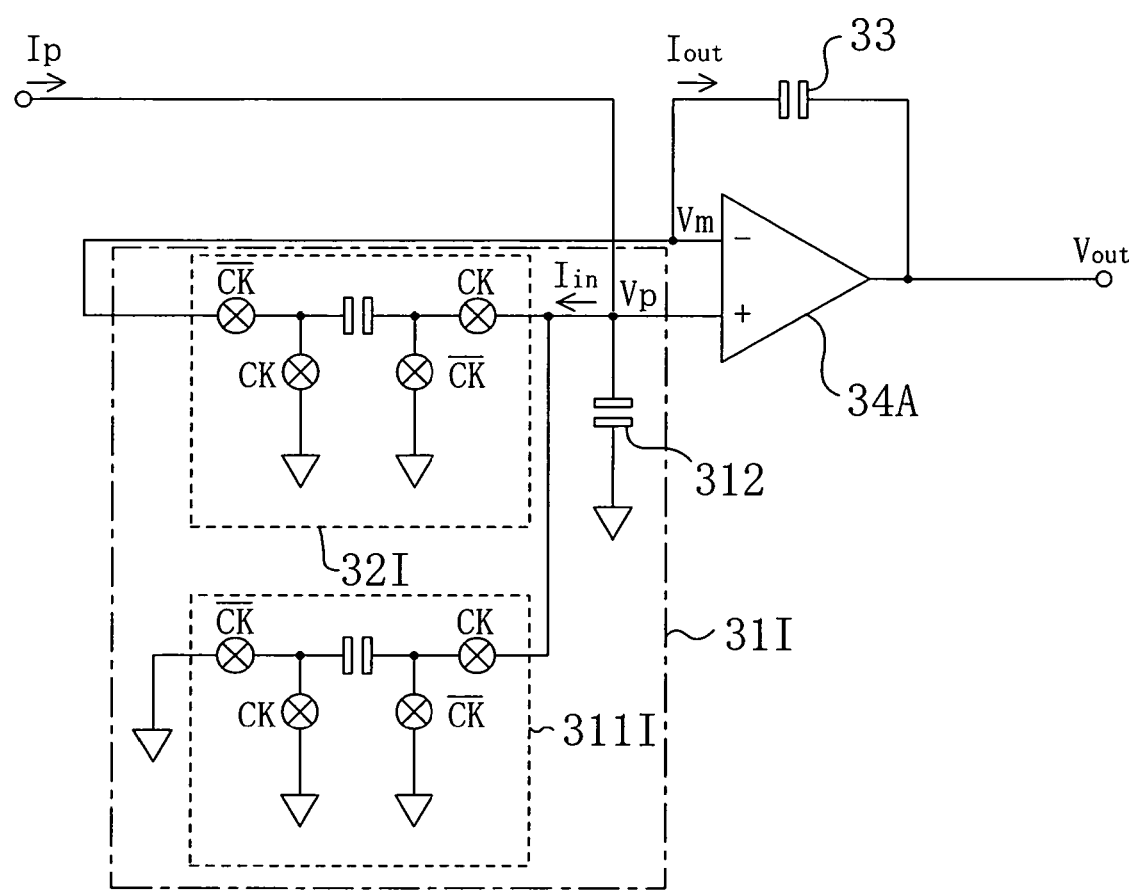
FIG. 18 is a circuit diagram of a low-pass filter according to Embodiment 9 of the invention.

FIG. 18 shows a low-pass filter according to Embodiment 9 of the invention. The low-pass filter 30I of this embodiment is a second-order active filter including a capacitive element 312, switched capacitor circuits 311I and 321, a capacitive element 33 and an operational amplifier 34A. Herein, a difference from Embodiment 1 alone will be described. The description of elements similar to those of Embodiment 1 is omitted by referring to them with like reference numerals used in FIG. 2. The low-pass filter 30I can be constructed as a semiconductor integrated circuit.

The switched capacitor circuits 311I and 321 are of a type designated as a parasitic capacitance insensitive type or a P.I. (Parasitic Insensitive) type, and form first filtering means 311 together with the capacitive element 312. Each of the switched capacitor circuits 311I and 321 is electrically connected to the input side of a current Ip when a clock CK is at a predetermined logic level, for example, at "H" level (which state is designated as a first connection state). Therefore, a first current Iin flows through the switched capacitor circuits 311I and 32I in accordance with a first voltage Vp. In other words, the switched capacitor circuits 311I and 32I correspond to a circuit element of the first filtering means 311. On the other hand, when a clock /CK obtained by inverting the clock CK is at a predetermined logic level, for example, at "H" level, the switched capacitor circuit 311I is electrically connected to a reference voltage and the switched capacitor circuit 32I is electrically connected to the capacitive element 33 (which state is designated as a second connection state). Accordingly, the capacitive element 33 accepts a second current Iout from the switched capacitor circuit 32I, namely, the switched capacitor circuit 32I corresponds to current generating means.

At this point, a rate between the total capacitance value of the switched capacitor circuits 311I and 32I and the capacitance value of the switched capacitor circuit 32I is set to 1:α (whereas 0<α<1). In this manner, the second current Iout becomes α times as large as a first current Iin, so that the capacitance value of the capacitive element 33 can be reduced. As described with reference to FIG. 4, α can be reduced to approximately $1/10$ through $1/100$.

When the switching rate of the switched capacitor circuits 311I and 32I is sufficiently higher than the time constant of the low-pass filter 30I, the low-pass filter 30I can attain a transfer characteristic equivalent to that of the low-pass filter 30A of FIG. 4. As the switching clock CK for the switched capacitor circuits 311I and 32I, for example, an input clock of a PLL including the low-pass filter 30I as a loop filter can be used. Also, as the switching rate is higher, the capacitance value of the capacitive element used in the switched capacitor circuit can be smaller, and therefore, a clock of a higher frequency, such as an output clock of the PLL, is preferably used.

In this manner, according to this embodiment, since no offset current is caused, there is no need to provide the offset compensating means. Accordingly, the circuit scale can be reduced as compared with that of the low-pass filter 30A of FIG. 4. Furthermore, since a switched capacitor circuit generally does not include a resistive component that may cause thermal noise, the anti-noise characteristic can be improved as compared with the case where a current mirror circuit is used.

Although the switched capacitor circuits 311I and 32I of this embodiment are of the P.I. type, they may be of a type designated as a parasitic capacitance sensitive type or a P.S. (Parasitic Sensitive) type.

It goes without saying that the low-pass filter 30I of this embodiment is applicable to any of the first low-pass filter unit 30a and the second low-pass filter unit 30b of the low-pass filter 30H shown in FIG. 16.

(Embodiment 10)

Figure 19:
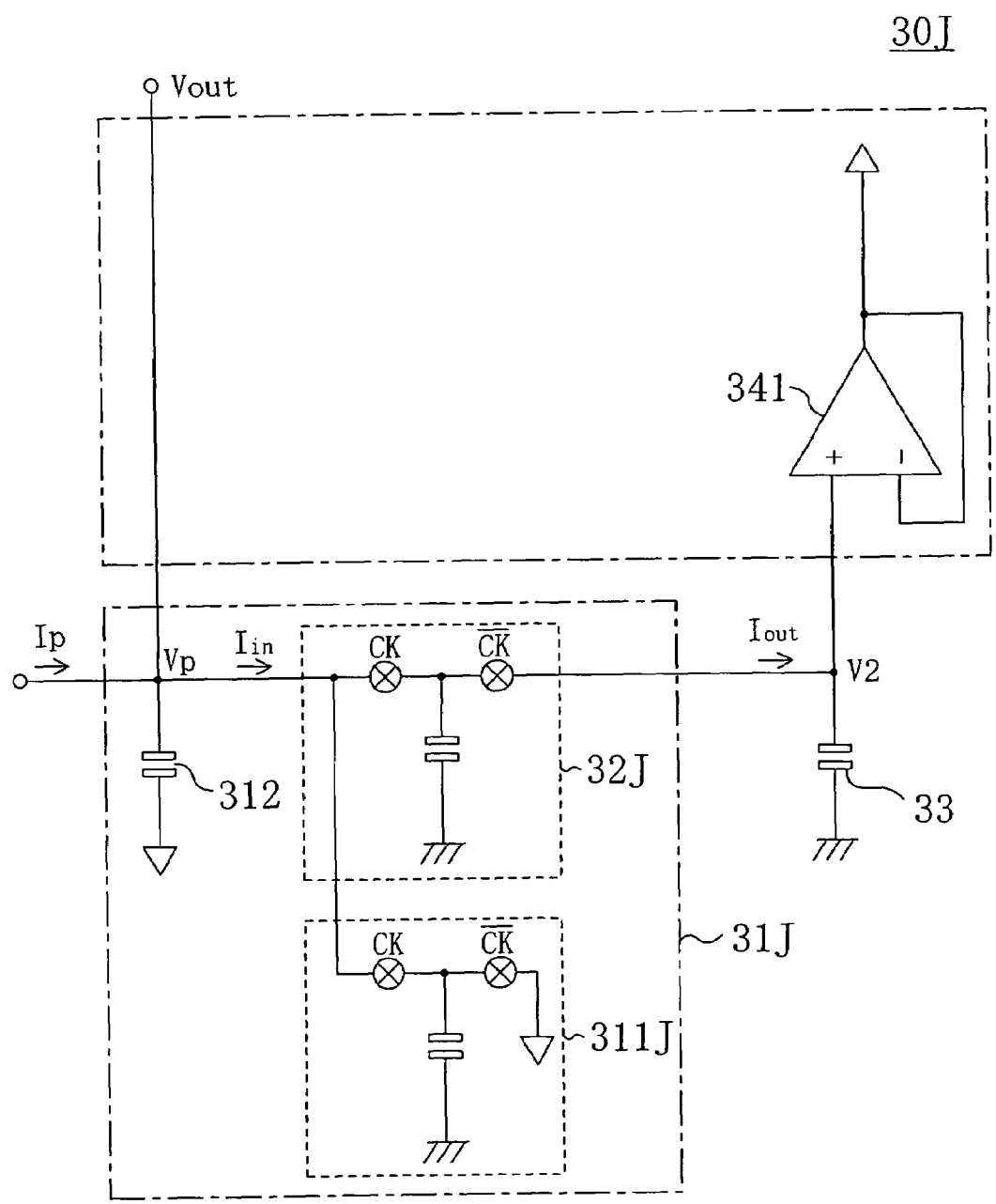
FIG. 19 is a circuit diagram of a low-pass filter according to Embodiment 10 of the invention.

FIG. 19 shows a low-pass filter according to Embodiment 10 of the invention. The low-pass filter 30J of this embodiment is obtained by modifying the low-pass filter 30I of FIG. 18, and is a second-order active filter including a capacitive element 312, P.S. type switched capacitor circuits 311J and 32J, a capacitive element 33 and adding means 34J. The low-pass filter 30J can be constructed as a semiconductor integrated circuit.

The switched capacitor circuits 311J and 32J form first filtering means 31J together with the capacitive element 312. The operation of the switched capacitor circuits 311J and 32J is not herein described because it is the same as that of the switched capacitor circuits 311I and 32I of FIG. 18.

The adding means 34J includes a voltage follower circuit 341. Specifically, an operational amplifier is used to form the voltage follower circuit 341 in this embodiment.

The voltage follower circuit 341 accepts, as an input, a second voltage V2 generated when a second current Iout flows through the capacitive element 33. The output of the voltage follower circuit 341 is used as a reference voltage connected to one end of each of the capacitive element 312 and the switched capacitor circuit 311J. Accordingly, the adding means 34J outputs a voltage Vout obtained by adding the second voltage V2 generated at the both ends of the capacitive element 33 to a first voltage generated in the first filtering means 31J.

Also in the low-pass filter 30J, similarly to the low-pass filter 30I of FIG. 18, the capacitance value of the capacitive element 33 can be reduced by setting the rate between the total capacitance value of the switched capacitor circuits 311J and 32J and the capacitance value of the switched capacitor 32J to 1:α (whereas 0<α<1). Also, as a clock CK for controlling the switching of the switched capacitor circuits 311J and 32J, an input clock or an output clock of a PLL including the low-pass filter 30J as a loop filter can be used.

In this manner, according to this embodiment, the same effects as those attained by Embodiment 9, namely, the reduction of the circuit scale and the improvement of the anti-noise characteristic, can be attained.

Figure 20:
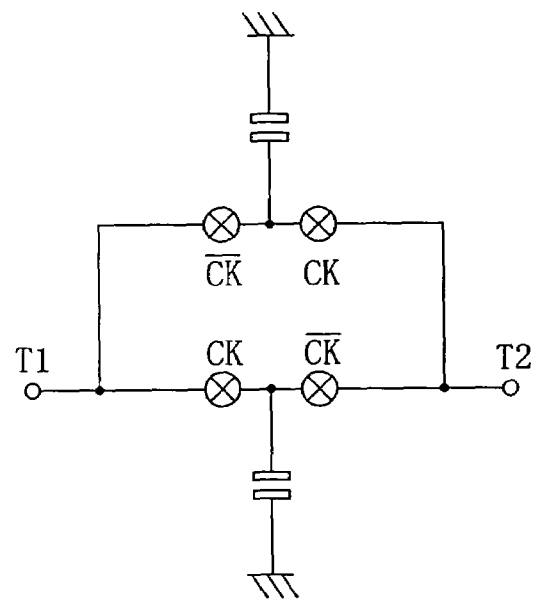
FIGS. 20(a) and 20(b) are circuit diagrams of switched capacitor circuits connected in parallel to each other.
Figure 20:
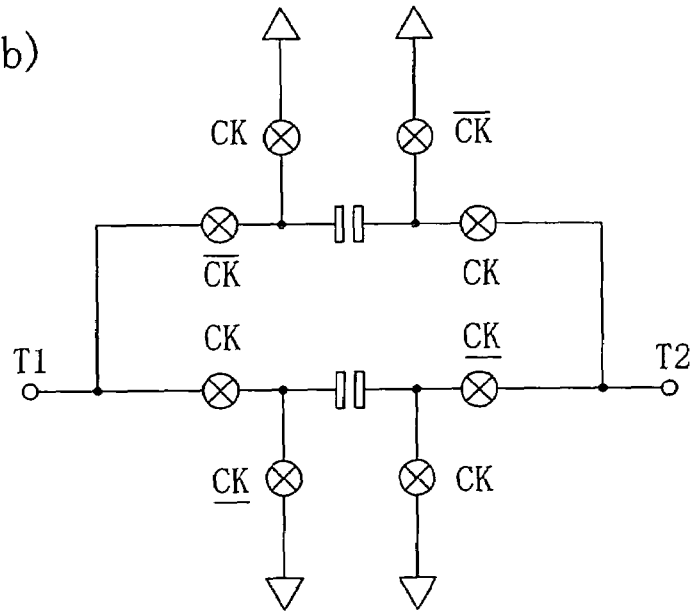

In the low-pass filter 30I of FIG. 18 or the low-pass filter 30J of FIG. 19, two switched capacitor circuits connected in parallel to each other can be used as another switched capacitor circuit. FIG. 20 shows switched capacitor circuits connected in parallel to each other. In FIG. 20(a), P.S. type circuits are connected in parallel, and in FIG. 20(b), P.I. type circuits are connected in parallel. In employing either type, when one of the circuits connected in parallel is electrically connected to a terminal T1, the other is electrically connected to a terminal T2. The switched capacitor circuits thus connected in parallel can attain a double sampling rate as compared with a single switched capacitor circuit, and their capacitance is never varied through switching.

In the low-pass filter 30I of FIG. 18, either of P.I. type switched capacitor circuits connected in parallel and P.S. type switched capacitor circuits connected in parallel may be used.

It goes without saying that the low-pass filter 30J of this embodiment is applicable to any of the first low-pass filter unit 30a and the second low-pass filter unit 30b of the low-pass filter 30H of FIG. 16.

(Embodiment 11)

Figure 21:
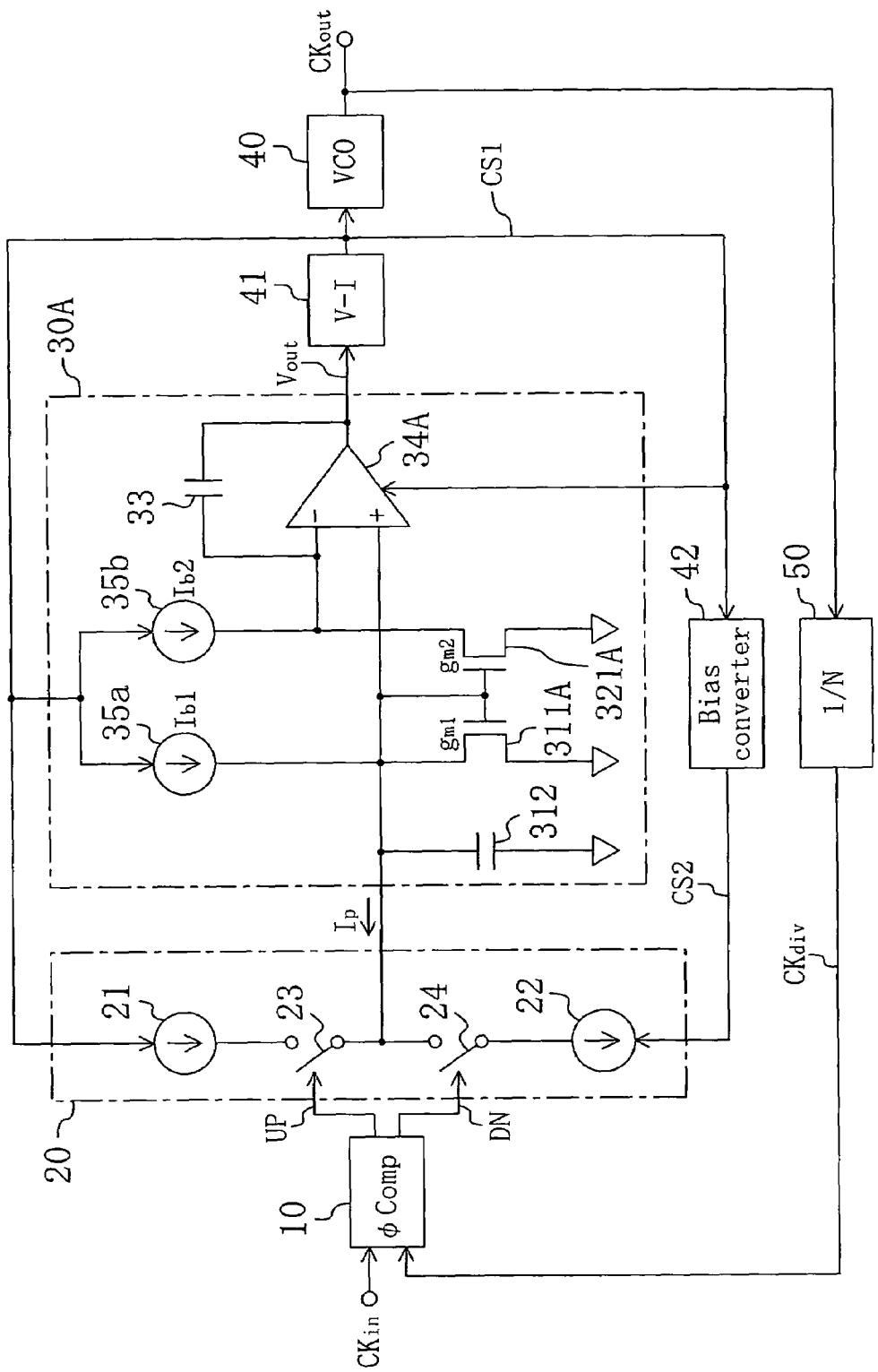
FIG. 21 is a diagram for showing the architecture of a phase-locked loop according to Embodiment 11 of the invention.

FIG. 21 shows the architecture of a PLL according to Embodiment 11 of the invention. The PLL of this embodiment includes a phase comparator 10, a charge pump circuit 20, a loop filter 30A, a voltage controlled oscillator 40, a voltage-current converter 41, a bias converter 42 and an N frequency divider 50. The PLL of this embodiment is usable as a multiple PLL, a synchronization extraction PLL or a skew control PLL. The N frequency divider 50 may be omitted in accordance with the use. Also, the PLL of this embodiment can be constructed as a semiconductor integrated circuit.

As the loop filter 30A of the PLL of this embodiment, the low-pass filter 30A of Embodiment 1 is used, whereas the offset compensating means 36 and the bias controlling means 37 of the low-pass filter 30A are omitted. In FIG. 21, like reference numerals are used to refer to like elements of the loop filter 30A shown in FIG. 2, and the description of the architecture and operation of the loop filter 30A is omitted. The loop filter 30A accepts, as an input, a charge current Ip output by the charge pump circuit 20, and outputs a voltage Vout as an output signal. The capacitive element 33 used in the loop filter 30A can be downsized as described above.

The charge pump circuit 20 generates the charge current Ip on the basis of a phase difference between an input clock Ckin and a feedback clock CKdiv having been compared by the phase comparator 10. Current sources 21 and 22 included in the charge pump circuit 20 change the amplitude of the charge current Ip in accordance with bias control signals CS1 and CS2, respectively.

The voltage controlled oscillator 40 corresponds to the output clock generating means of this invention. The voltage controlled oscillator 40 oscillates an output clock CKout, and changes the oscillation frequency on the basis of the voltage Vout output from the loop filter 30A. Actually, the voltage controlled oscillator 40 is not directly controlled on the basis of the voltage Vout, but changes the frequency of the output clock CKout in accordance with the bias control signal CS1 that is accepted as an input and has been converted into a current by the voltage-current converter 41.

The voltage-current converter 41 corresponds to the bias controlling means of this invention. The voltage-current converter 41 converts the voltage Vout output from the loop filter 30A into the bias control signal CS1. The bias control signal CS1 controls not only the voltage controlled oscillator 40 but also the current source 21 of the charge pump circuit 20 and the current sources 35a and 35b of the loop filter 30A. Furthermore, the bias control signal CS1 is converted into the bias control signal CS2 by the bias converter 42 and thereafter controls the current source 22 of the charge pump circuit 20. The bias converter 42 is provided because the polarity of the bias control of the current source 22 is different from that of the other current sources. Furthermore, the bias control signal CS1 controls the band characteristic of the operational amplifier 34A of the loop filter 30A.

Under the control of the current sources 21, 22, 35a and 35b by the bias control signals CS1 and CS2, the amplitudes of currents output from these current sources are allowed to change to the same extent. Specifically, in the case where the amplitude of the charge current Ip output from the current sources 21 and 22 is changed by A times, the amplitudes of the first and second bias currents Ib1 and Ib2 output from the current sources 35a and 35b are changed also by A times.

Next, the operation of the PLL having the aforementioned architecture, and a method for controlling the dumping factor in particular, will be described in detail. When the loop filter 30A is used in the PLL, the loop order of the PLL is 3. However, it is difficult to analyze a PLL with a transfer function of the third-order loop, and hence, the description is herein approximately given as a second-order loop.

The response characteristic of a PLL including a second-order active loop filter is determined depending upon a natural frequency $\omega n$ represented by the following equation (9) and a dumping factor $\zeta$ represented by the following equation (10), wherein K0 is a gain of the voltage controlled oscillator 40:

$$\omega n = \sqrt{\frac{Ko \cdot Ip}{2\pi C}} \quad (9)$$

-continued $$\zeta = \frac{CR}{2} \cdot \sqrt{\frac{Ko \cdot Ip}{2\pi C}} = \frac{CR}{2} \cdot \omega n \quad (10)$$

Among the variables for determining the natural frequency $\omega n$ of the equation (9), one easily changeable in the circuit is the charge current Ip. Therefore, when the loop bandwidth, namely, the natural frequency $\omega n$, is to be changed in accordance with the oscillation frequency of the PLL, the charge current Ip is generally changed.

When the charge current Ip is changed, the dumping factor $\zeta$ of the equation (10) is simultaneously unavoidably changed. However, also for stabilizing the response characteristic of the PLL, the dumping factor $\zeta$ is preferably kept constant. For this purpose, assuming that the charge current Ip is changed at a change rate of A in the equation (10), the capacitance value C or the resistance value R should be changed at a change rate of $1/\sqrt{A}$.

The drain and the gate of the transistor 311A is connected to each other, and hence, the transistor 311A is in a state providing what is called a square-law characteristic. Also, the gate of the transistor 321A has the same potential as the gate of the transistor 311A, and hence, the transistor 321A is also in the state providing the square-law characteristic.

In the case where the current sources 21 and 22 of the charge pump circuit 20 change the charge current Ip at the change rate A in accordance with the supplied bias control signals CS1 and CS2, the current sources 35a and 35b of the loop filter 30A also change the first and second bias current Ib1 and Ib2 at the change rate A in accordance with the supplied bias control signal CS1. As a result, with respect to the transistor 311A, the drain current is changed by A times, the first conductance gm1 is changed by $\sqrt{A}$ times, and the gate voltage Vp is changed by $\sqrt{A}$ times. In other words, the time constant of the first filtering means is changed in accordance with the bias change. Similarly, with respect to the transistor 321A, the drain current is changed by A times, the second conductance gm2 is changed by $\sqrt{A}$ times, and the gate voltage Vm is changed by $\sqrt{A}$ times.

The conductance gm1 and gm2 of the transistors 311A and 321A being changed by $\sqrt{A}$ times is equal to the change rate of the resistance value R being changed to $1/\sqrt{A}$. Accordingly, it is understood that the change rate A of the charge current Ip is cancelled by the change rate $1/\sqrt{A}$ of the resistance value R in the equation (10), so that the dumping factor $\zeta$ can be constant.

Furthermore, in the PLL of this embodiment, the oscillation frequency of the voltage controlled oscillator 40 is changed in accordance with the bias control signal CS1 output by the voltage-current converter 41, and in accordance with this change of the oscillation frequency, the charge current Ip supplied from the current sources 21 and 22 of the charge pump circuit 20, the first and second bias currents Ib1 and Ib2 supplied from the current sources 35a and 35b of the loop filter 30A and the band characteristic of the operational amplifier 34A of the loop filter 30A are changed. In other words, adapting to the change of the oscillation frequency of the PLL, the bias of the charge pump circuit 20 and the loop filter 30A can be changed (which method is hereinafter designated as the adaptive bias method). Specifically, in the case where the oscillation frequency of the voltage controlled oscillator 40 is low, the charge current Ip and the first and second bias currents Ib1 and Ib2 of the loop filter 30A are small, and in the case where the oscillation frequency is high, the charge current Ip and the first and second bias currents Ib1 and Ib2 of the loop filter 30A are large.

Such a PLL employing the adaptive bias method has been known (as described in document 1: John G. Maneatis, "Low-Jitter Process-Independent DLL and PLL Based on Self-Biased Techniques", IEEE JOURNAL OF SOLID-STATE CIRCUITS, VOL. 31, NO. 11, November 1996, pp. 1723–1732). However, the circuit system described in document 1 employs the adaptive bias method for a PLL with responses of second-order alone. In contrast, in this embodiment, the adaptive bias method is employed in the PLL with responses of third-order, that is, the second-order loop filter 30A and the voltage controlled oscillator 40, and furthermore, in the PLL with responses of fourth-order additionally including the control of the band characteristic of the operational amplifier 34A.

In this manner, according to this embodiment, the capacitive element 33 included in the loop filter 30A can be downsized, so that the circuit area of the whole PLL can be largely reduced. Also, when the amplitudes of the first and second bias currents Ib1 and Ib2 of the loop filter 30A are controlled, the dumping factor ζ of the PLL can be adjusted to be constant. Therefore, the optimal response characteristic can be always kept regardless of the oscillation frequency of the PLL. Also, there is no need to provide a resistor ladder circuit and the like for adjusting the dumping factor ζ, and hence, the circuit area of the PLL can be reduced.

Furthermore, the charge current Ip, the first and second bias currents Ib1 and Ib2 of the loop filter 30A and the band characteristic of the operational amplifier 34A are adaptably changed in accordance with the oscillation frequency of the PLL. Therefore, the response characteristic of the PLL can be optimally kept over a wide range of oscillation frequency. Moreover, a band gap reference for supplying a reference voltage to the current sources 21, 22, 35a and 35b can be omitted, and hence, the circuit area of the PLL can be further reduced.

The charge current Ip and the first and second bias currents Ib1 and Ib2 of the loop filter 30A are not necessarily controlled on the basis of the bias control signal CS1 output by the voltage-current converter 41. Also, the band characteristic of the operational amplifier 34A is not necessarily controllable. Even when the PLL thus does not employ the adaptive bias method, the circuit area can be reduced.

The low-pass filter 30A of Embodiment 1 is used as the loop filter 30A in this embodiment, which does not limit the invention. For example, any of the low-pass filters 30B through 30F of Embodiments 2 through 6 and the low-pass filters 30I and 30J of Embodiments 9 and 10 may be used as the loop filter or another low-pass filter having any other architecture may be used.

(Embodiment 12)

Figure 22:
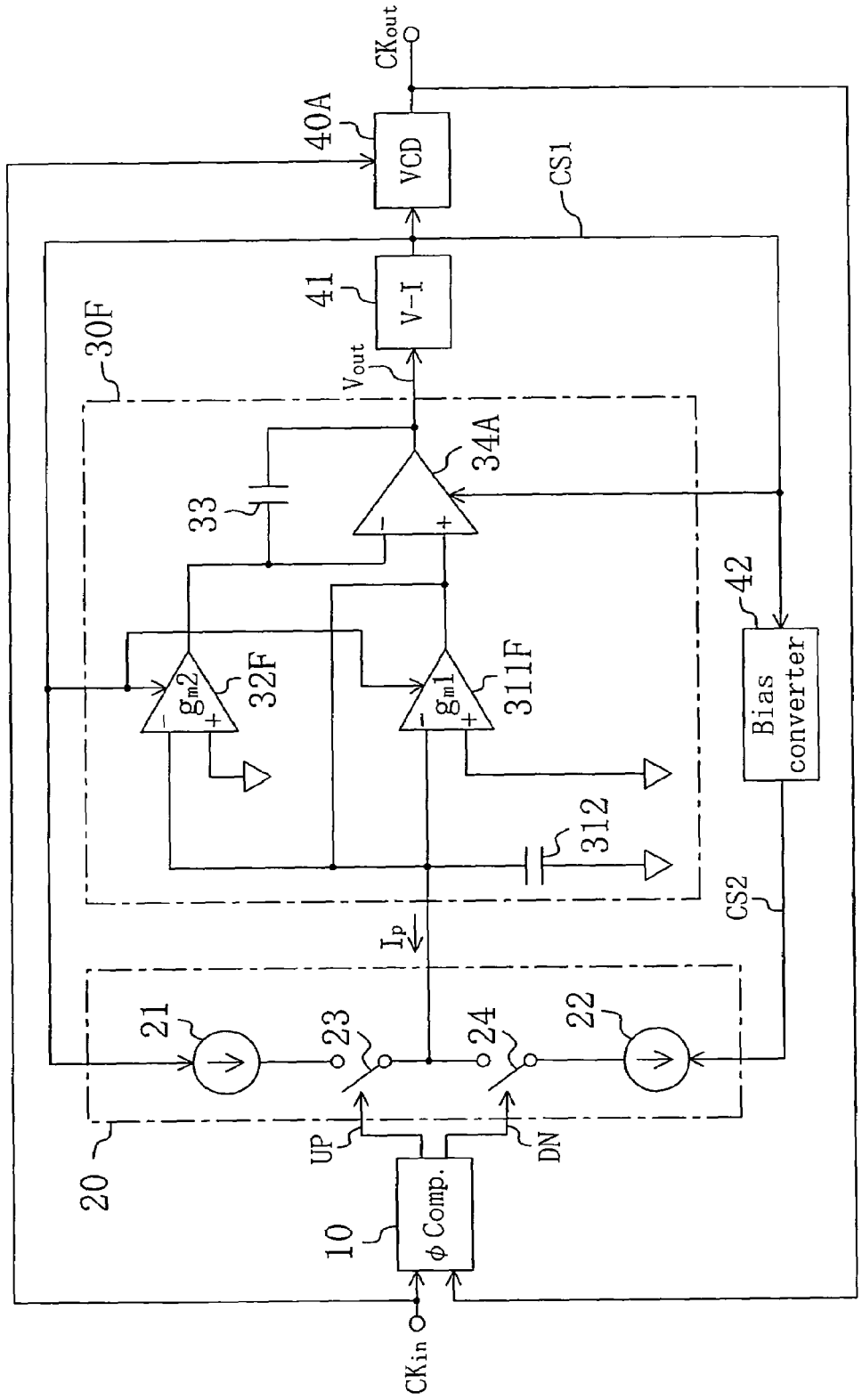
FIG. 22 is a diagram for showing the architecture of a delay-locked loop according to Embodiment 12 of the invention.

FIG. 22 shows the architecture of a delay-locked loop (DLL) according to Embodiment 12 of the invention. In this embodiment, a part of the PLL of Embodiment 11 is replaced to form the DLL. Herein, a difference from Embodiment 11 alone will be described. The description of elements similar to those of Embodiment 11 is omitted by referring to them with like reference numerals used in FIG. 21.

A loop filter 30F of the DLL of this embodiment uses the low-pass filter 30F of Embodiment 6. In FIG. 21, respective circuit elements of the loop filter 30F are referred to with like reference numerals used in FIG. 15, and the description of the architecture and operation of the loop filter 30F is omitted. The loop filter 30F accepts, as an input, a charge current Ip output by the charge pump circuit 20, and outputs a voltage Vout as an output signal. The capacitive element 33 used in the loop filter 30F can be downsized as described above.

The first and second conductance gm1 and gm2 of the voltage-current converters 311F and 32F of the loop filter 30F are changed at a change rate √A in accordance with the change of the charge current Ip by the bias control signal CS1 at a change rate A. Thus, the dumping factor ζ can be adjusted to be constant against the change of the charge current Ip as described in Embodiment 11.

A voltage controlled delay circuit 40A corresponds to the output clock generating means of this invention. The voltage controlled delay circuit 40A generates, on the basis of the voltage Vout output from the loop filter 30F, an output clock CKout by delaying an input clock CKin accepted as an input. Actually, the voltage controlled delay circuit 40A is not directly controlled on the basis of the voltage Vout, but generates the output clock CKout by providing a delay in accordance with the bias given by the bias control signal CS1 having been converted into a current by the voltage-current converter 41.

In this manner, according to this embodiment, the capacitive element 33 of the loop filter 30F can be downsized, so that the circuit area of the whole DLL can be largely reduced. Also, when the conductance of the voltage-current converters 311F and 32F of the loop filter 30F are controlled, the dumping factor ζ of the DLL can be adjusted to be constant without providing a resistor ladder circuit or the like.

The low-pass filter 30F of Embodiment 6 is used as the loop filter 30F in this embodiment, which does not limit the invention. For example, any of the low-pass filters 30A through 30E of Embodiments 1 through 5 and the low-pass filters 30I and 30J of Embodiments 9 and 10 may be used, or another low-pass filter having any other architecture may be used.

(Embodiment 13)

In the case where the adaptive bias method is employed in a PLL as in Embodiment 11, when the output current from the voltage-current converter 41 becomes zero, the charge current Ip and the first and second bias currents Ib1 and Ib2 of the loop filter 30A are also controlled to be zero in accordance with the bias control signal CS1, and therefore, the PLL is stabilized in the quiescent state. Accordingly, in the case where the oscillation frequency is gradually increased for locking, the system is stabilized in a zero state at the startup, which leads to a problem that the PLL does not operate. Therefore, in a PLL employing the adaptive bias method, the oscillation frequency is gradually reduced from the maximum for locking, and hence, the PLL is provided with startup means.

Figure 23:
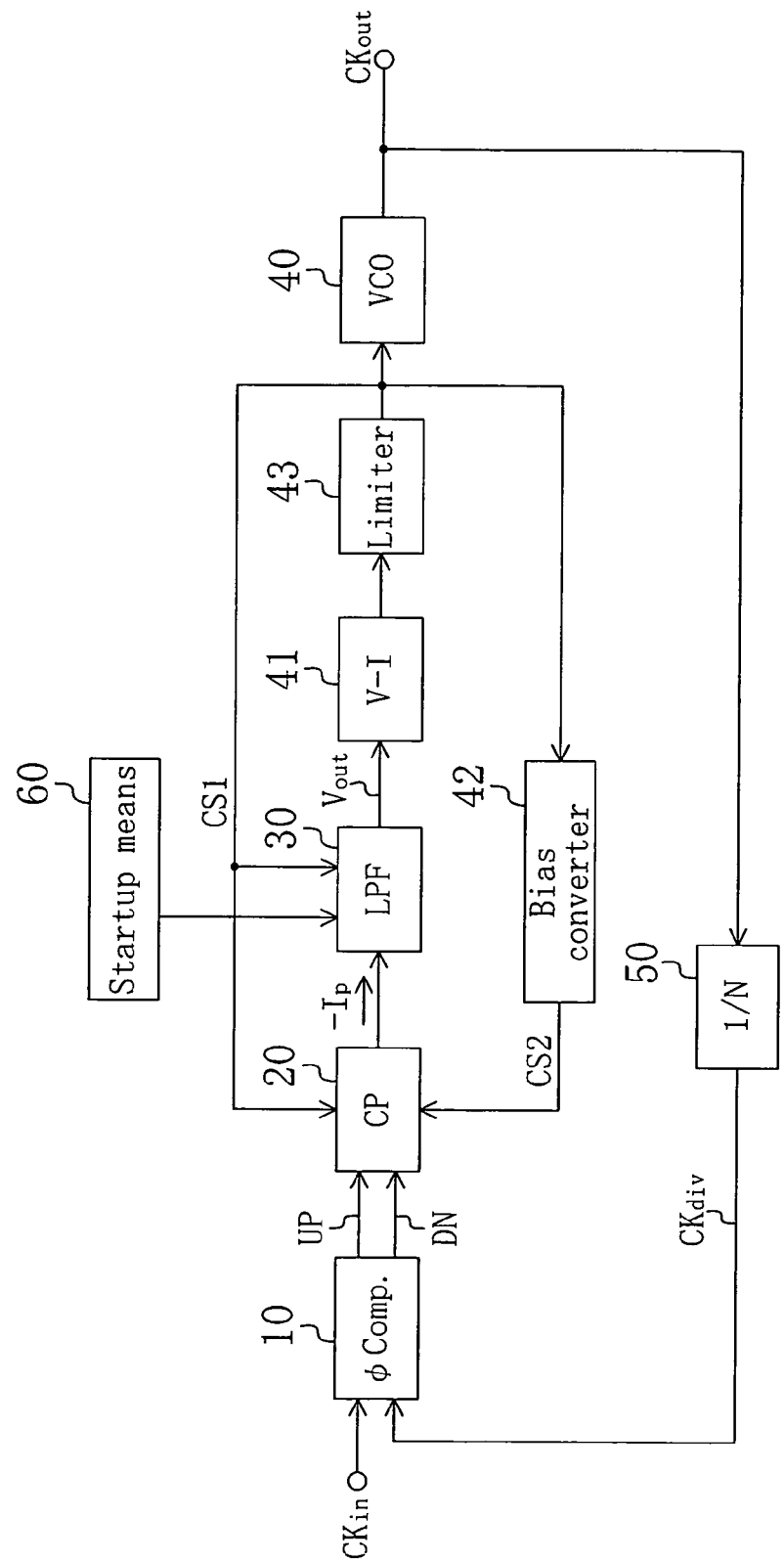
FIG. 23 is a diagram for showing the architecture of a phase-locked loop according to Embodiment 13 of the invention.

FIG. 23 shows the architecture of a PLL according to Embodiment 13 of the invention. The PLL of this embodiment is obtained by providing startup means 60 in the PLL of Embodiment 11. Now, the startup means 60 will be described in detail.

The startup means 60 switches a voltage Vout that is the output signal of the loop filter 30 between a first state where the voltage Vout is set to the output from the adding means of the loop filter 30 and a second state where it is set to a given startup voltage. At the startup of the PLL, the second state is set, so that the PLL can be driven in the state where the oscillation frequency is the maximum.

When the PLL is started in the state where the oscillation frequency of the voltage controlled oscillator 40 is the maximum, if the frequency is too high, malfunction is caused in the N frequency divider 50, and hence, the frequency of the feedback clock CKdiv may become zero. When this occurs, the phase comparator 10 controls the system so as to increase the oscillation frequency, which leads to the so-called deadlock state. Therefore, a limiter 43 is disposed at a stage following the current-voltage converter 41, so as to limit the bias given to the voltage controlled oscillator 40, and thus, the oscillation frequency is prevented from becoming too high.

Figure 24:
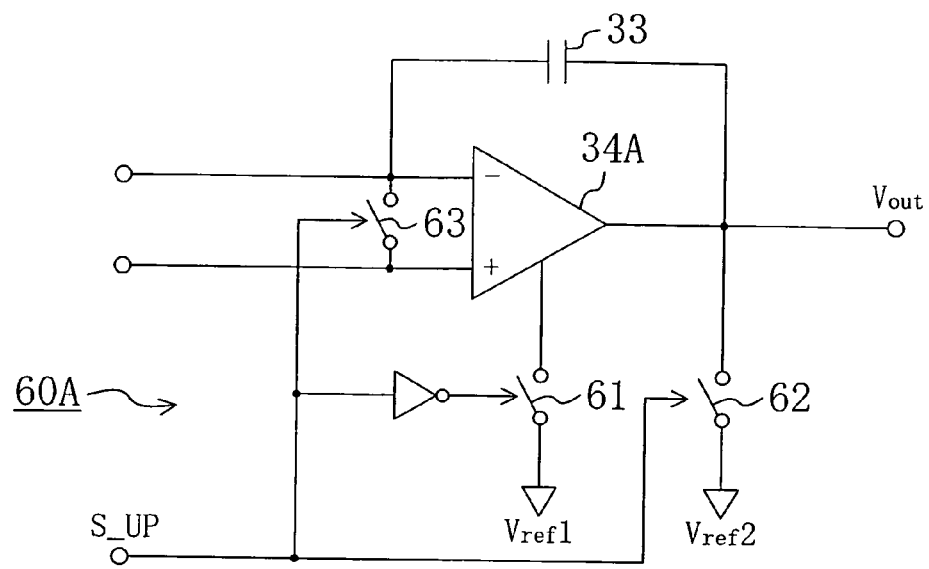
FIG. 24 is a circuit diagram of an example of startup means of the phase-locked loop of FIG. 23.

FIG. 24 shows a specific example of the startup means. This startup means 60A includes a switch 61 for switching the power supply to the operational amplifier 34A, a switch 62 for switching setting of the output of the loop filter 30 to a voltage Vref2, and a switch 63 for switching the input terminals of the operational amplifier 34A between short-circuit and disconnection. The capacitive element 33 and the operational amplifier 34A respectively correspond to the second filtering means and the adding means of the loop filter 30.

When a startup signal S_UP is at first logic level (for example, at "H" level), the switch 61 is opened and the switches 62 and 63 are closed. Since the switch 61 is opened, the power supply to the operational amplifier 34A is cut off, and hence, there is no output from the operational amplifier 34A. Instead, the switch 62 is closed, so that the output voltage Vout of the loop filter 30 can be set to the given startup voltage Vref2 (which corresponds to the second state). Also, since the switch 63 is closed, a voltage at the non-inverting input terminal of the operational amplifier 34A is supplied to the capacitive element 33. This voltage is nothing but the first voltage of this invention. In other words, when the startup signal S_UP is at first logic level, the operational amplifier 34A is placed in a non-operational state, and the PLL is started in the second state where the output of the loop filter 30 is set to the voltage Vref2. Thus, the system can be prevented from stabilizing in the zero state at the startup.

After starting the PLL, the startup signal S_UP is changed to second logic level (for example, "L" level). Thus, the switch 61 is closed and the switches 62 and 63 are opened. Since the switches 62 and 63 are opened, the input terminals of the operational amplifier 34A are disconnected, and the voltage Vref2 is cut off from the output side of the loop filter 30. In addition, since the switch 61 is closed, the operational amplifier 34A is placed in an operational state, and the output of the loop filter 30 is set to the output of the operational amplifier 34A (which corresponds to the first state). Thus, the PLL becomes operable in the steady state.

An operational amplifier amplifies a potential difference between its inverting input terminal and non-inverting input terminal. Accordingly, in switching the operational amplifier 34A from the non-operational state of the second state to the operational state of the first state, if there is a potential difference between the input terminals, an excessive output is momentarily generated, which may disturb the system. In this embodiment, however, the input terminals of the operational amplifier 34A are short-circuited through the switch 63 in the second state and hence there is no potential difference therebetween. Therefore, in switching to the first state, the operational amplifier 34A never outputs an excessive output. In this manner, the switch 63 not only supplies the first voltage to the capacitive element 33 in the first state but also prevents the operational amplifier 34A from outputting an excessive output in switching to the second state.

Figure 25:
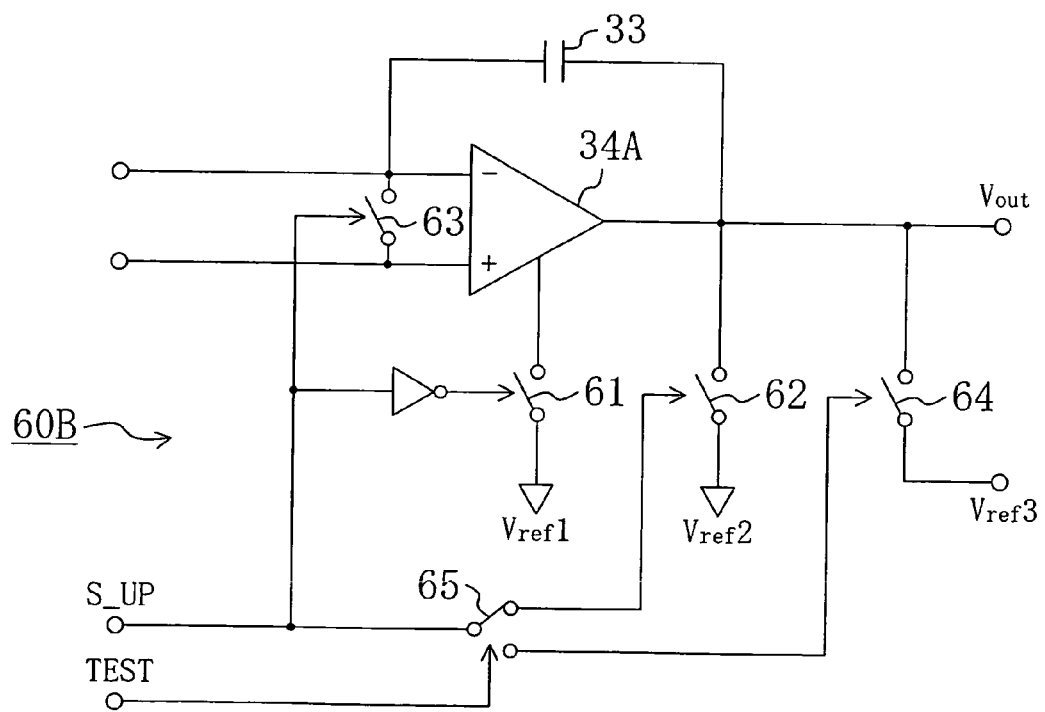
FIG. 25 is a circuit diagram of an example of the startup means applicable to a test mode.

In general, a PLL is provided with a test mode for measuring a voltage-oscillation frequency characteristic of the voltage controlled oscillator 40. Therefore, the startup means 60 is improved to be applicable to the test mode as follows:

FIG. 25 shows a specific example of the startup means applicable to the test mode. This startup means 60B includes, in addition to the elements of the startup means 60A, switches 64 and 65. The switch 65 switches, in accordance with a test signal TEST, a target to be controlled by the startup signal S_UP between the switches 62 and 64. The switch 64 switches setting of the output of the loop filter 30 to a voltage Vref3. The voltage Vref3 is externally supplied.

When the test signal TEST is at first logic level (for example, at "H" level), the switch 65 selects the switch 64 as the target to be controlled by the startup signal S_UP. Thus, the PLL is placed in a test mode, in which the PLL can be started with the output of the loop filter 30 set to the externally supplied voltage Vref3. Therefore, when the PLL is started with the voltage Vref3 variously set, the voltage-oscillation frequency characteristic can be measured.

On the other hand, when the test signal TEST is at second logic level (for example, at "L" level), the test mode is reset. Therefore, the PLL can be started with the output of the loop filter 30 set to a voltage Vref2, that is, the internal power supply.

In this manner, according to this embodiment, the PLL employing the adaptive bias method is provided with the startup means 60, and hence, it is possible to avoid the problem that system is stabilized in the zero state at the startup and the PLL is not operated. Furthermore, when the startup means 60 is made applicable to a test mode, the voltage-oscillation frequency characteristic of the voltage controlled oscillator 40 can be easily measured.

The output of the operational amplifier 34A is stopped by cutting off the power supply with the switch 61 in this embodiment, which does not limit the invention. The output of the operational amplifier 34A can be substantially stopped by, for example, providing high impedance to the output side of the operational amplifier 34A. Even when the output is thus stopped, the aforementioned effect can be unchangeably attained.

(Embodiment 14)

Figure 26:
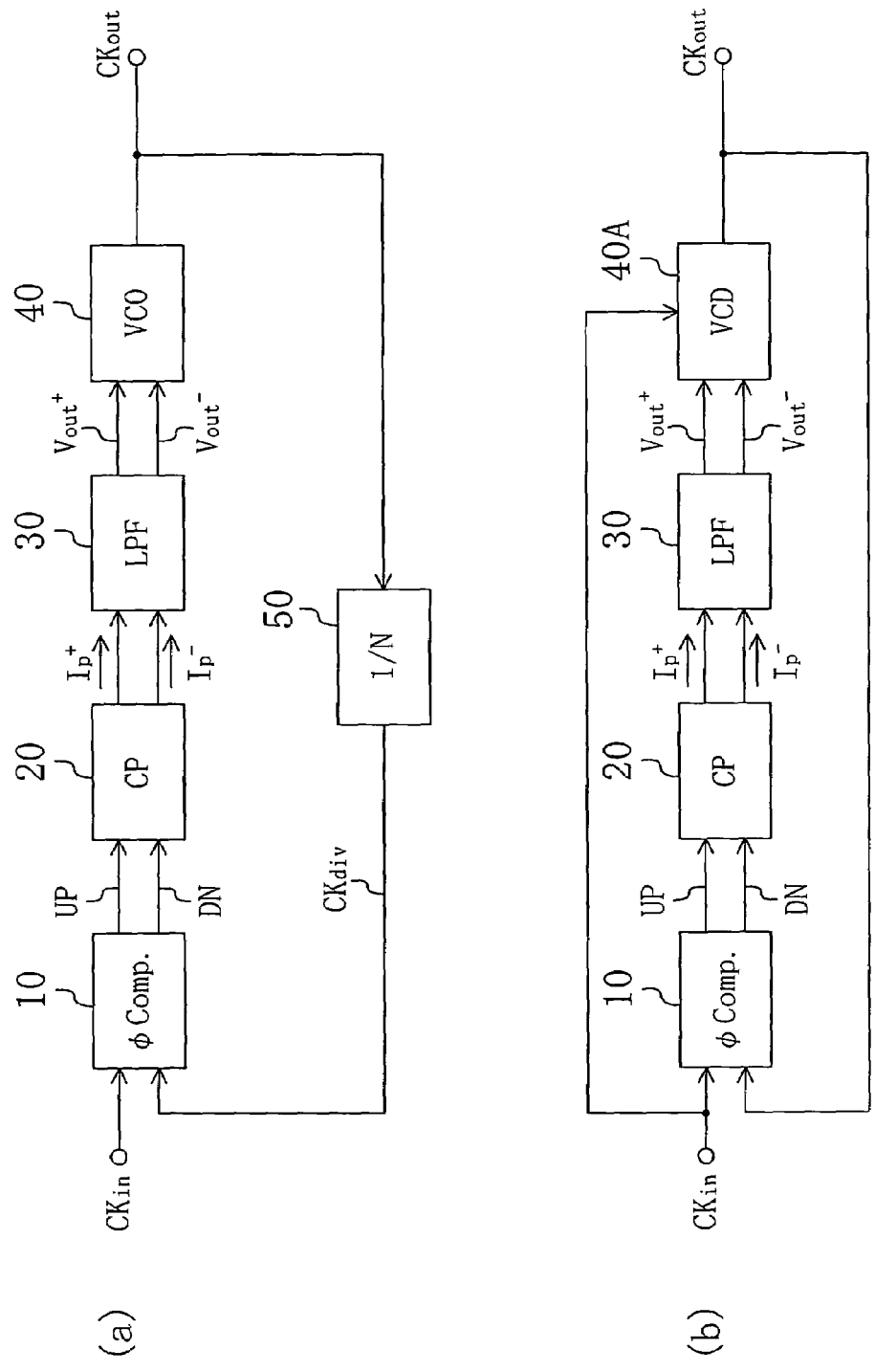
FIGS. 26(a) and 26(b) are diagrams for showing the architectures of feedback systems according to Embodiment 14 of the invention.

FIG. 26 shows the architectures of feedback systems according to Embodiment 14 of the invention, in which FIG. 26(a) shows the feedback system for a PLL and FIG. 26(b) shows the feedback system for a DLL. The feedback system of this embodiment uses, as a loop filter 30, a filter for accepting and supplying differential signals as its input and output. Also, a voltage controlled oscillator 40 and a voltage controlled delay circuit 40A accept differential signals as their inputs.

As the loop filter 30 used in the feedback systems of this embodiment, for example, the low-pass filter 30G of Embodiment 7 or the low-pass filter 30H of Embodiment 8 can be used. Thus, the circuit area of the whole feedback system can be largely reduced.

(Embodiment 15)

As described above, when a current mirror circuit is used in a loop filter, an offset current is caused. When an offset current is caused in the loop filter, a PLL corresponding to a feedback loop is operated so as to cancel the offset current, and a charge current is supplied from a charge pump circuit. As a result, a stationary phase error is caused in the output clock of the PLL. Therefore, a PLL capable of canceling a stationary phase error will be considered.

Figure 27:
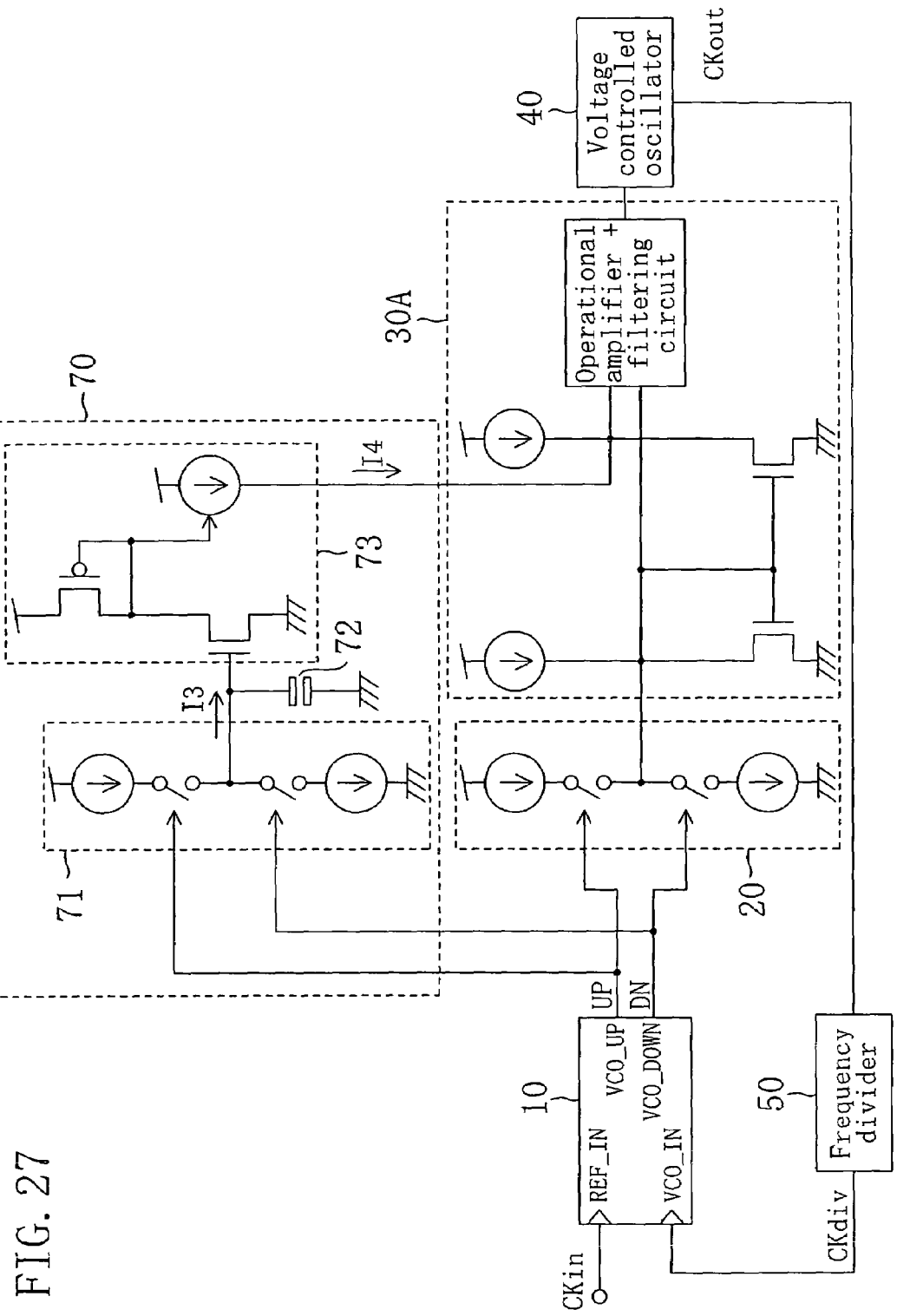
FIG. 27 is a diagram for showing the architecture of a phase-locked loop according to Embodiment 15 of the invention.

FIG. 27 shows the architecture of a PLL according to Embodiment 15 of the invention. The PLL of this embodiment includes, as a loop filter 30A, a low-pass filter using a current mirror circuit according to, for example, Embodiment 1, and further includes a stationary phase error canceling circuit 70. Herein, a difference from Embodiment 11 alone will be described. The description of elements similar to those of Embodiment 11 is omitted by referring to them with like reference numerals used in FIG. 21.

The stationary phase error canceling circuit 70 includes a charge pump circuit 71 that generates a current 13 on the basis of a phase difference between an input clock Ckin and a feedback clock CKdiv compared by a phase comparator 10, namely, in accordance with signals UP and DN output by the phase comparator 10; a capacitive element 72 serving as charge storing means for accepting the current 13; and a voltage controlled current source 73 for generating a current 14 in accordance with a voltage generated in the capacitive element 72.

The stationary phase error canceling circuit 70 is operated as follows: The charge pump circuit 71 converts the signals UP and DN appearing as a stationary phase error into a current 13. The current 13 is integrated by the capacitive element 72, so as to generate a current 14 on the basis of the integrated voltage. The current 14 generated by the voltage controlled current source 73 is fed back to the output side of the current mirror circuit of the loop filter 30A. Thus, an offset current caused in the loop filter can be compensated.

In this manner, according to this embodiment, in a PLL using a current mirror circuit in a loop filter, a stationary phase error can be automatically canceled.

Although the current 14 generated by the voltage controlled current source 73 is fed back to the output side of the current mirror circuit of the loop filter 30A in the above description, it may be fed back to the input side. However, in this case, the current 13 generated by the charge pump circuit 71 should have a reverse polarity.

Also, a DLL including the stationary phase error canceling circuit 70 can be constructed.

EXAMPLES OF APPLICATION OF FEEDBACK SYSTEM OF THE INVENTION

Figure 28:
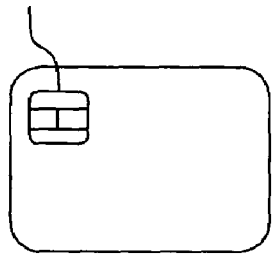
FIG. 28 is a diagram of exemplified application of a PLL or DLL of this invention to an IC card.

The PLL and the DLL of this invention do not need a large-scale capacitive element and their circuit scales can be made small, and therefore, application to the following products can be expected in particular:

FIG. 28 shows exemplified application of the PLL or DLL of this invention to an LSI for an IC card. Since an LSI used in an IC card is limited in the area, the PLL and DLL of this invention that can be constructed in a smaller circuit area are particularly suitably applied to an IC card.

Figure 29:
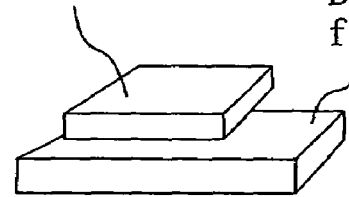
FIG. 29 is a diagram of exemplified application of the PLL or DLL of this invention to a COC component.

FIG. 29 shows exemplified application of the PLL or DLL of this invention to a chip-on-chip (COC) component. In a chip-on-chip structure, an upper semiconductor integrated circuit is limited in its circuit area. Accordingly, the PLL and the DLL of this invention are useful.

Figure 30:
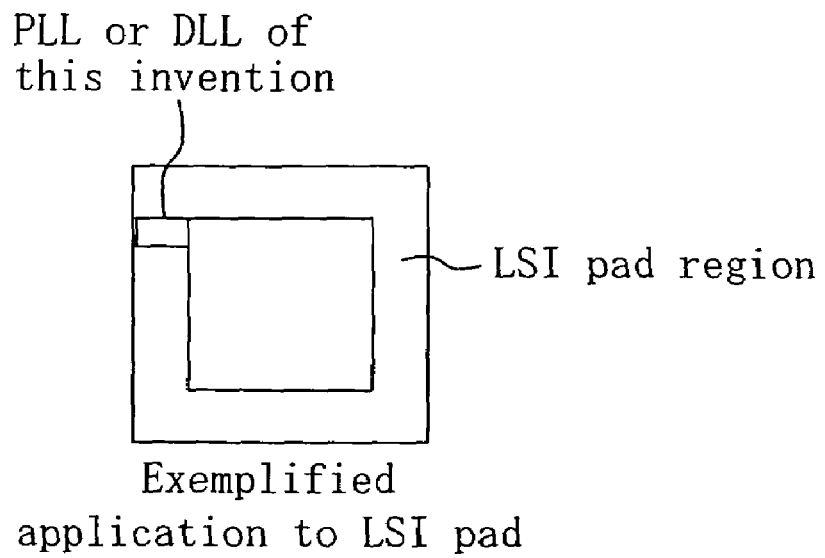
FIG. 30 is a diagram of exemplified application of the PLL or DLL of this invention provided on an LSI pad region.

FIG. 30 shows exemplified application of the PLL or DLL of this invention provided on an LSI pad region. In the same manner as in the chip-on-chip structure, the circuit area that can be provided on an LSI pad region is limited. Accordingly, the PLL and the DLL of this invention are useful.

Figure 31:
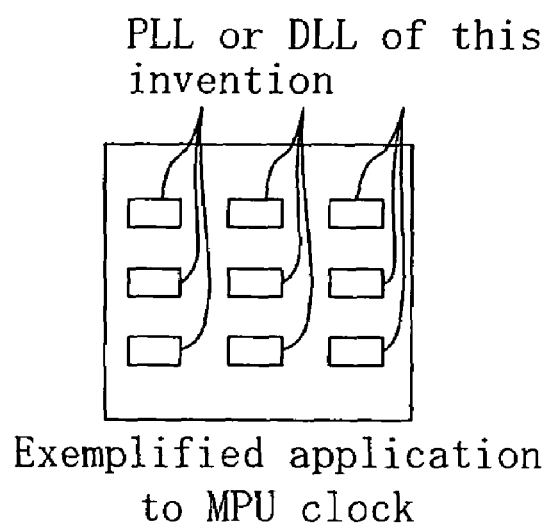
FIG. 31 is a diagram of exemplified application of the PLL or DLL of this invention provided in a microprocessor.

FIG. 31 shows exemplified application of the PLL or the DLL of this invention provided in a microprocessor as clock generating means. Today, a microprocessor includes a very large number of PLLs and DLLs. Therefore, when the PLL and DLL of this invention are used in a microprocessor, the circuit area of the whole microprocessor can be expected to be largely reduced. Accordingly, the application of the PLL and DLL of this invention to a microprocessor can attain an extremely remarkable effect.

So far, various preferred embodiments of the invention have been described. In the above description, the transistors 311A and 321A of the current mirror circuit 32A may be n-channel or p-channel transistors. Also, although these transistors are field effect transistors (MOS transistors) in the embodiments, they may be bipolar transistors or a combination of a MOS transistor and a bipolar transistor. Furthermore, their input sides may be a diode. Such modifications never affect the effect of the invention.

Furthermore, the capacitive elements 312, 312' and 312H included in the first filtering means and the capacitive elements 33, 33a and 33b corresponding to the second filtering means may be any of a capacitive element using two-layered polysilicon, an MIM capacitor (metal-insulator-metal capacitor) and a MOS capacitor using a MOS transistor. Alternatively, even when a combination of these capacitive elements is used, the effect of the invention is never spoiled.

As described so far, according to the low-pass filter of the invention, the circuit area can be largely reduced while keeping a filtering characteristic equivalent to that of a conventional one. In particular, the capacitive element used as the second filtering means can be downsized to approximately $\frac{1}{10}$ through $\frac{1}{100}$ of a conventional one, and hence, the effect to reduce the circuit area is very remarkable. Also, since the second current smaller than the first current is generated by the current generating means, the power consumption can be reduced.

Further according to the invention, in the feedback system for a phase-locked loop or a delay-locked loop provided with the above-described low-pass filter as a loop filter, the dumping factor can be adjusted without providing a resistor ladder circuit or the like. Therefore, the circuit area of the feedback system can be further reduced. Moreover, the response characteristic of the feedback system can be adaptably adjusted in accordance with the output of the loop filter. Accordingly, the response characteristic can be optimally kept over a wide range of frequency band.

The invention claimed is:

1. A low-pass filter comprising:
   first filtering means that receives an input signal to said low-pass filter and outputs a first voltage;
   a circuit element included in said first filtering means for generating a first current in accordance with said first voltage;
   current generating means for generating a second current at a given rate to said first current;
   second filtering means that receives said second current and outputs a second voltage; and
   adding means for adding said first voltage and said second voltage and outputting an output signal of said low-pass filter,
   wherein said given rate is a positive number smaller than 1.

2. The low-pass filter of claim 1,
   wherein said current generating means is a current mirror circuit that has, on an input side thereof, a first semiconductor element with first conductance, and on an output side thereof, a second semiconductor element with second conductance at said given rate to said first conductance, said current mirror circuit receives said first current and outputs said second current, and said circuit element is said first semiconductor element.

3. The low-pass filter of claim 1, wherein said circuit element is a resistive element with a resistance value corresponding to said first conductance instead, said current generating means is a current mirror circuit that has, on an input side thereof, a first semiconductor element with first conductance, and on an output side thereof, a second semiconductor element with second conductance at said given rate to said first conductance, and said current mirror circuit receives a third current corresponding to said first current and outputs said second current.

4. The low-pass filter of claim 1, wherein said circuit element is a first voltage-current converter with first conductance for converting said first voltage into said first current, and said current generating means is a second voltage-current converter with second conductance at said given rate to said first conductance for converting said first voltage into said second current.

5. The low-pass filter of claim 1, wherein said adding means is an operational amplifier that has said second filtering means in a negative feedback portion thereof, accepts, as an input, said first voltage at a non-inverting input terminal thereof and outputs a third voltage as said output signal.

6. The low-pass filter of claim 1, wherein said adding means is an operational transconductance amplifier that receives said first and second voltages and outputs a third current as said output signal.

7. The low-pass filter of claim 2, further comprising:

a first current source for supplying a first bias current; and a second current source for supplying a second bias current, wherein said first semiconductor element is a first transistor that provides said first conductance in accordance with said first bias current, said second semiconductor element is a second transistor that provides said second conductance in accordance with said second bias current, and said first and second current sources change the amplitudes of said first and second bias currents in accordance with a common bias control signal supplied from the outside, respectively.

8. The low-pass filter of claim 2, wherein said current mirror circuit has, on an output side thereof, said second through nth (wherein n is a natural number of 3 or more) semiconductor elements and includes switches for respectively switching outputs of currents flowing through said second through nth semiconductor elements, and said switches allow one of or a sum of a plurality of the currents respectively flowing through said second through nth semiconductor elements to be output as said second current.

9. The low-pass filter of claim 3, further comprising:

a first current source for supplying a first bias current; and a second current source for supplying a second bias current, wherein said first semiconductor element is a first transistor that provides said first conductance in accordance with said first bias current, said second semiconductor element is a second transistor that provides said second conductance in accordance with said second bias current, said first and second current sources change the amplitudes of said first and second bias currents in accordance with a common bias control signal supplied from the outside, respectively, and said resistive element is a resistor ladder circuit that provides a resistance value corresponding to the reciprocal of said first conductance varying in accordance with said first bias current.

10. The low-pass filter of claim 4, wherein said first and second conductance vary in accordance with a common bias control signal supplied from the outside.

11. The low-pass filter of claim 2, further comprising:

a current source for supplying a bias current; and offset compensating means for adjusting said bias current in accordance with said output signal obtained with said first current cut off, wherein at least one of said first and second semiconductor elements is a transistor that provides at least one of said first and second conductance in accordance with said bias current.

12. The low-pass filter of claim 11, wherein said offset compensating means includes voltage holding means for holding a voltage of said output signal obtained with said first current cut off, and adjusts said bias current in accordance with said voltage held by said voltage holding means.

13. The low-pass filter of claim 11, wherein said offset compensating means includes:

a comparator for comparing a voltage of said output signal obtained with said first current cut off with a reference voltage;

an updown counter for incrementing or decrementing a counter value thereof in accordance with an output of said comparator; and a DA converter for converting said counter value into an analog value, and said offset compensating means adjusts said bias current in accordance with an output of said DA converter.

14. The low-pass filter of claim 2, wherein said second semiconductor element is a transistor that provides said second conductance in accordance with a supplied first bias current, and said low-pass filter further comprises:

a replica circuit having an identical architecture to a portion including said second semiconductor element, said second filtering means and said adding means;

a first current source for supplying said first bias current;

a second current source for supplying a second bias current to a transistor included in said replica circuit correspondingly to said second semiconductor element; and offset compensating means for adjusting said first and second bias current in accordance with an output of said replica circuit.

15. The low-pass filter of claim 14, wherein said offset compensating means is an inverting amplifier.

16. The low-pass filter of claim 2, further comprising:

a first current source for supplying a first bias current;

a second current source for supplying a second bias current; and bias adjusting means for adjusting said first and second bias currents in accordance with temperature change, wherein said first semiconductor element is a first transistor that provides said first conductance in accordance with said first bias current, and said second semiconductor element is a second transistor that provides said second conductance in accordance with said second bias current.

17. The low-pass filter of claim 16, wherein said bias adjusting means includes:
   a third transistor corresponding to said first transistor; and
   a fourth transistor corresponding to said second transistor, and said bias adjusting means adjusts bias currents with a given current difference respectively supplied to said third and fourth transistors, in such a manner that a given voltage difference is caused between said third and fourth transistors, and adjusts said first and second bias current in accordance with the adjustment of said bias current.

18. The low-pass filter of claim 16, wherein said bias adjusting means is a temperature compensating circuit that changes said first and second bias currents in proportion to the temperature change.

19. The low-pass filter of claim 1, wherein said circuit element includes a first switched capacitor circuit and a second switched capacitor circuit having one end connected to one end of said first switched capacitor circuit and the other end connected to said second filtering means, and generates said first current when said first and second switched capacitor circuits are in a first connection state, and said current generating means corresponds to said second switched capacitor circuit, has a capacitance value at said given rate to a sum of capacitance values of said first and second switched capacitor circuits, and generates said second current when said first and second switched capacitor circuits are in a second connection state.

20. The low-pass filter of claim 19, wherein said adding means includes a voltage follower circuit receiving said second voltage, and said first filtering means outputs said first voltage in accordance with an output voltage of said voltage follower circuit.

21. The low-pass filter of claim 19, wherein at least one of said first and second switched capacitor circuits is connected to a third switched capacitor circuit in parallel, and when one of said first or second switched capacitor circuit and said third switched capacitor circuit connected in parallel is electrically connected to a first terminal, the other is electrically connected to a second terminal.

22. A low-pass filter for receiving a differential signal between first and second input signals and outputting a differential signal between first and second output signals, comprising:

two low-pass filters according to claim 1, wherein one of said two low-pass filters receives said first input signal and outputs said first output signal, and the other of said two low-pass filters receives said second input signal and outputs said second output signal.

23. The low-pass filter of claim 22, wherein said current generating means is a current mirror circuit that has, on an input side thereof, a first semiconductor element with first conductance, and on an output side thereof, a second semiconductor element with second conductance at said given rate to said first conductance, said current mirror circuit receives said first current and outputs said second current, and said circuit element is said first semiconductor element.

24. The low-pass filter of claim 22, wherein said circuit element is a first voltage-current converter with first conductance for converting said first voltage into said first current, and said current generating means is a second voltage-current converter with second conductance at said given rate to said first conductance for converting said first voltage into said second current.

25. A feedback system for feeding back an output clock, generated in accordance with on an input clock, to make said output clock attain a desired characteristic, comprising:

a charge pump circuit for generating first and second charge currents in accordance with a phase difference between said input clock and a clock resulting from the feedback;

a loop filter having the low-pass filter according to claim 22, said loop filter filtering a differential signal between said first and second charge currents and outputting first and second output signals; and output clock generating means for generating said output clock in accordance with a differential signal between said first and second output signals.

26. A semiconductor integrated circuit comprising the low-pass filter according to claim 1.

27. A feedback system for feeding back an output clock, generated in accordance with an input clock, to make said output clock attain a desired characteristic, comprising:

a charge pump circuit for generating a charge current in accordance with a phase difference between said input clock and a clock resulting from the feedback;

a loop filter for filtering said charge current; and output clock generating means for generating said output clock in accordance with an output signal from said loop filter, wherein said loop filter includes:
   first filtering means for filtering said charge current and outputting a first voltage;
   a circuit element included in said first filtering means for generating a first current in accordance with said first voltage;
   current generating means for generating a second current at a given rate to said first current;
   second filtering means for filtering said second current and outputting a second voltage; and
   adding means for adding said first voltage and said second voltage and outputting said output signal, and said given rate is a positive number smaller than 1.

28. The feedback system of claim 27, wherein said output clock generating means is a voltage controlled oscillator that oscillates said output clock and changes an oscillation frequency in accordance with said output signal from said loop filter.

29. The feedback system of claim 27, wherein said output clock generating means is a voltage controlled delay circuit that changes a delay of said output clock from said input clock in accordance with said input clock and said output signal from said loop filter.

30. The feedback system of claim 27, further comprising:

a stationary phase error canceling circuit including a charge pump circuit for generating a third current in accordance with a phase difference between said input clock and said clock resulting from the feedback, charge storing means for storing charge provide by said third current, and a voltage controlled current source for generating a fourth current in accordance with a voltage generated in said charge storing means, wherein said loop filter includes:
  a first current source for supplying a first bias current; and
  a second current source for supplying a second bias current,
said current generating means is a current mirror circuit that has, on an input side thereof, a first field effect transistor for providing first conductance in accordance with said first bias current, and on an output side thereof, a second field effect transistor for providing second conductance at said given rate to said first conductance in accordance with said second bias current,
said current mirror circuit receives said first current on the input side thereof and said foruth current on one of the input and output sides thereof, and outputs said second current, and
said circuit element is said first field effect transistor.

31. The feedback system of claim 27,
wherein said circuit element is capable of changing conductance thereof, and
said feedback system further comprises bias controlling means for controlling said conductance of said circuit element and said charge current by a common bias control signal.

32. The feedback system of claim 31,
wherein said loop filter includes:
  a first current source for supplying a first bias current; and
  a second current source for supplying a second bias current,
said current generating means is a current mirror circuit that has, on an input side thereof, a first field effect transistor for providing first conductance in accordance with said first bias current, and on an output side thereof, a second field effect transistor for providing second conductance at said given rate to said first conductance in accordance with said second bias current,
said current mirror circuit receives said first current and outputs said second current,
said circuit element is said first field effect transistor, and
said first and second current sources change said first and second bias current in accordance with said common bias control signal, respectively.

33. The feedback system of claim 31,
wherein said circuit element is a first voltage-current converter with first conductance for converting said first voltage into said first current, said current generating means is a second voltage-current converter with second conductance at said given rate to said first conductance for converting said first voltage into said second current, and
said first and second voltage-current converters change said first and second conductance in accordance with said common bias control signal, respectively.

34. The feedback system of claim 31,
wherein said bias control signal is generated in accordance with said output signal from said loop filter.

35. The feedback system of claim 31,
wherein said adding means is an operational amplifier, and
said bias controlling means controls a band characteristic of said operational amplifier by said bias control signal.

36. The feedback system of claim 34, further comprising:
startup means for switching said output signal from said loop filter between a first state where said output signal is set to an output from said adding means and a second state where said output signal is set to a given voltage,
wherein said startup means sets said second state at the startup of said feedback system.

37. The feedback system of claim 36,
wherein said adding means is an operational amplifier that has said second filtering means in a negative feedback portion thereof, receives said first voltage at a non-inverting input terminal thereof and outputs a third voltage as said output signal,
said startup means has a switch for switching a connecting state of input terminals of said operational amplifier between short-circuit and disconnection, and
said switch disconnects said input terminals in said first state and short-circuits said input terminals in said second state.

38. The feedback system of claim 36,
wherein said startup means has a switch for switching a power source for said given voltage between an internal power source and an external power source.

39. A semiconductor integrated circuit comprising the feedback system according to claim 27.

40. The semiconductor integrated circuit of claim 39 used in an IC card.

41. The semiconductor integrated circuit of claim 39,
wherein said semiconductor integrated circuit has a chip-on-chip structure, and
said feedback system is included in an upper portion of said chip-on-chip structure.

42. The semiconductor integrated circuit of claim 39,
wherein said feedback system is provided on a pad region of said semiconductor integrated circuit.

43. The semiconductor integrated circuit of claim 39,
wherein said semiconductor integrated circuit is a microprocessor.

* * * * *

UNITED STATES PATENT AND TRADEMARK OFFICE
CERTIFICATE OF CORRECTION

PATENT NO. : 7,030,688 B2 Page 1 of 1
APPLICATION NO. : 10/500875
DATED : April 18, 2006
INVENTOR(S) : Shiro Dosho et al.

It is certified that error appears in the above-identified patent and that said Letters Patent is hereby corrected as shown below:

On the Title page of the Letters Patent,

Under section "(75) Inventors", change:
" Ikeda " to -- Osaka --,
" Takatsuki " to -- Osaka --,
" Uji " to -- Kyoto --,
" Ibaraki " to -- Osaka --,
" Katano " to -- Osaka --,
" Yawata " to -- Kyoto --,
" Takatsuki " to -- Osaka --

Signed and Sealed this

Fourteenth Day of November, 2006

JON W. DUDAS
*Director of the United States Patent and Trademark Office*